United States Patent
Shibuya et al.

(10) Patent No.: US 6,878,505 B2
(45) Date of Patent: Apr. 12, 2005

(54) PHOTOSENSITIVE COMPOSITION

(75) Inventors: Akinori Shibuya, Shizuoka (JP); Kazuto Kunita, Shizuoka (JP)

(73) Assignee: Fuji Photo Film Co., Ltd., Ashigara (JP)

(*) Notice: Subject to any disclaimer, the term of this patent is extended or adjusted under 35 U.S.C. 154(b) by 0 days.

(21) Appl. No.: 10/155,065

(22) Filed: May 28, 2002

(65) Prior Publication Data

US 2003/0077541 A1 Apr. 24, 2003

(30) Foreign Application Priority Data

May 28, 2001 (JP) .................................... P. 2001-159059
May 28, 2001 (JP) .................................... P. 2001-159180
May 28, 2001 (JP) .................................... P. 2001-159211

(51) Int. Cl.$^7$ .......................... G03F 7/029; G03F 7/031
(52) U.S. Cl. ................... 430/273.1; 430/302; 430/303; 430/284.1; 430/281.1; 430/285.1; 430/906; 430/926; 430/916; 430/912; 430/922; 430/947; 430/270.1; 430/280.1; 522/2; 522/16; 522/66; 522/18
(58) Field of Search .......................... 430/280.1, 270.1, 430/302, 303, 273.1, 284.1, 281.1, 285.1, 906, 926, 916, 920, 922, 947; 522/2, 16, 66, 18

(56) References Cited

U.S. PATENT DOCUMENTS

2003/0186165 A1 * 10/2003 Gries et al. ................. 430/302

FOREIGN PATENT DOCUMENTS

| EP | 1 048 982 A1 | 11/2000 |
| EP | 1 070 990 A1 | 1/2001 |
| EP | 1 079 276 A1 | 2/2001 |
| JP | 61-9621 B2 | 3/1996 |
| JP | 8-272096 A | 10/1996 |
| JP | 10-101719 A | 4/1998 |

OTHER PUBLICATIONS

U.S. Appl. No. 60/372,433, filed Apr. 15, 2002.*
English Abstract of JP 2000–222771, published Aug. 11, 2000.

* cited by examiner

Primary Examiner—Cynthia Hamilton
(74) Attorney, Agent, or Firm—Burns, Doane, Swecker & Mathis, L.L.P.

(57) ABSTRACT

A photosensitive composition comprising (i) a sensitizing dye represented by the following formula (I), (II) or (III) defined in the specification, (ii) a titanocene compound and (iii) a compound of undergoing a reaction with at least one of a radical and an acid to change at least one of its physical and chemical properties and maintaining the changed physical or chemical property, and a lithographic printing plate having a photosensitive layer comprising the photosensitive composition.

48 Claims, No Drawings

PHOTOSENSITIVE COMPOSITION

FIELD OF THE INVENTION

The present invention relates to a photosensitive composition containing a novel photo-initiation system, particularly a photo-initiation system having high sensitivity and excellent stability. Also, the present invention relates to a photosensitive composition excellent as a material for a lithographic printing plate precursor capable of plate-making by the scanning exposure based on digital signals. The photosensitive composition of the present invention can also be used, for example, for image formation such as optical image-forming, holography and color hard copy, for production of an electronic material such as photoresist or for uses as a photocurable resin material in ink, paint, adhesive or the like.

BACKGROUND OF THE INVENTION

Conventionally, a PS plate having a construction such that a lipophilic photosensitive resin layer is provided on a hydrophilic support has been widely used as a lithographic printing plate. As for the plate-making method, a desired printing plate is usually obtained by performing mask exposure through a lith film and then dissolving and removing the non-image area.

In recent years, digitization techniques of electronically processing, accumulating and outputting image information using a computer have been widespread and various new image output systems corresponding thereto have been put into practical use. As a result, a computer-to-plate (CTP) technique of directly producing a printing plate without using a lith film but by scanning high directivity light such as laser light based on the digitized image information is demanded and it is now an important technical subject to obtain a printing plate precursor suitable for such a technique.

As one of the means for obtaining such a lithographic printing plate capable of scanning exposure, a construction such that a photopolymerizable composition having excellent photosensitive speed is used as an ink-acceptable photosensitive resin layer (hereinafter referred to as a "photosensitive layer") provided on a hydrophilic support has been heretofore proposed and this is already available on the market. The printing plate precursor having such a construction is facilitated in the development processing and favored with good plate-making and printing performances of giving excellent resolution, inking property, press life and scumming resistance.

The photopolymerizable composition fundamentally comprises an ethylenically unsaturated compound, a photopolymerization initiation system and a binder resin, where the photo-initiation system absorbs light to produce an active radical and the radical induces the addition polymerization of ethylenically unsaturated compound, as a result, the photosensitive layer is insolubilized, thereby effecting the image formation. Most of conventional proposals regarding the photopolymerizable composition capable of being subjected to scanning exposure use a photo-initiation system having excellent photosensitivity and many compositions therefor are described, for example, in Bruce M. Monroe et al., *Chemical Review*, 93, 435 (1993) and R. S. Davidson, *Journal of Photochemistry and Biology A: Chemistry*, 73, 81 (1993).

For the purpose of elevating productivity in the plate-making step, it is demanded to perform the writing at a higher speed, however, conventional CTP systems using a photopolymerizable composition comprising the above-described initiation system and using a long wavelength visible light source such as Ar laser (488 nm) or FD-YAG laser (532 nm) as the light source cannot satisfy such a requirement because the output of light source or the sensitivity of photosensitive material is not sufficiently high.

On the other hand, a semiconductor laser using, for example, an InGaN system material and capable of continuous oscillation in the region from 350 to 450 nm has been recently put into practical use. The scanning exposure system using such a short wavelength light source is advantageous in that since the semiconductor laser can be produced at a low cost in view of its structure, an economical system can be constructed while having sufficiently high output. Also, as compared with conventional systems using an FD-YAG or Ar laser, a photosensitive material having a photosensitive range in the shorter wavelength region and enabling working under brighter safe light can be used.

In the imaging field, the technique for obtaining a photo-initiation system having high sensitivity is still keenly demanded as described, for example, in J. P. Faussier, *Photoinitiated Polymerization-Theory and Applications: Rapra Review, Vol. 9, Report*, Rapra Technology (1998) and M. Tsunooka et al., *Prog. Polym. Sci.*, 21, 1 (1996).

However, a photo-initiation system having sensitivity sufficiently high for the scanning exposure in the short wavelength region of 350 to 450 nm is not known to date.

Conventionally, an initiation system comprising a combination of a specific dye and a titanocene compound is known as a relatively high-sensitive photo-initiation system. A combination of a dye having an oxazolidine acidic nucleus with a triazine photo-initiator is disclosed in JP-B-61-9621 (the term "JP-B" as used herein means an "examined Japanese patent publication") but this compound is poor in the storage stability and has a problem in the production. Also, a combination of a dye having an oxazolone acidic nucleus with titanocene is disclosed in JP-A-8-272096 (the term "JP-A" as used herein means an "unexamined published Japanese patent application") and a combination of a dye having a 5-membered heterocyclic acidic nucleus with titanocene is disclosed in JP-A-10-101719. These compounds have certainly high sensitivity but the sensitivity is still not satisfied and when a laser light source having a wavelength of 450 nm or less is used, a sufficiently high sensitivity cannot be obtained in practice. Thus, these compounds are not suitable for use with a short wavelength light source.

SUMMARY OF THE INVENTION

An object of the present invention is to provide a photosensitive composition having excellent workability, profitability and storage stability, which can be used as a material of a lithographic printing plate precursor for scanning exposure suitable for the CTP system or as a material of a lithographic printing plate precursor highly sensitive to the oscillation wavelength of an inexpensive short wavelength semiconductor laser.

Another object of the present invention is to provide a lithographic printing plate precursor having a photosensitive layer formed of a photosensitive composition using a novel photopolymerization initiation system highly sensitive to a wide wavelength region from 350 to 450 nm.

As a result of extensive investigations to achieve these objects, the present inventors have found that when a sensitizing dye having a structure represented by formula (I), (II) or (III) shown below is used, a photosensitive composition having sufficiently high sensitivity to the oscillation wavelength of a short wavelength semiconductor laser and moreover, being excellent in the storage stability can be obtained. The present invention has been accomplished based on such findings.

The present invention includes the following items, (1) A photosensitive composition comprising (i) a sensitizing dye represented by the following formula (I), (II) or (III), (ii) a titanocene compound and (iii) a compound of undergoing a reaction with at least one of a radical and an acid to change at least one of its physical and chemical properties and maintaining the changed physical or chemical property:

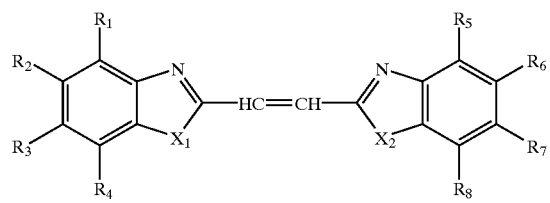

(I)

wherein $R_1$ to $R_8$ each independently represents a hydrogen atom, a halogen atom, a substituted or unsubstituted alkyl, alkoxy, alkylthio, aryloxy, arylthio, alkenyl, aralkyl, acyl, aryl, heteroaryl or alkylsulfonic acid group having 20 or less carbon atoms, and $X_1$ and $X_2$ each independently represents an oxygen atom or a sulfur atom;

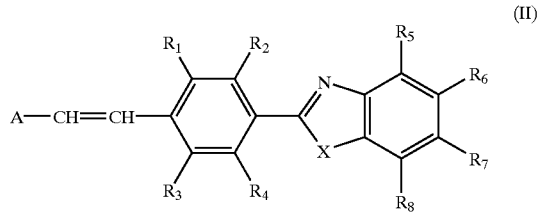

(II)

wherein $R_1$ to $R_8$ each independently represents a hydrogen atom, a halogen atom, a substituted or unsubstituted alkyl, alkoxy, alkylthio, aryloxy, arylthio, alkenyl, aralkyl, acyl, aryl, heteroaryl or alkylsulfonic acid group having 20 or less carbon atoms, X represents an oxygen atom or a sulfur atom, and A represents a substituted or unsubstituted aryl or heteroaryl group having 20 or less carbon atoms;

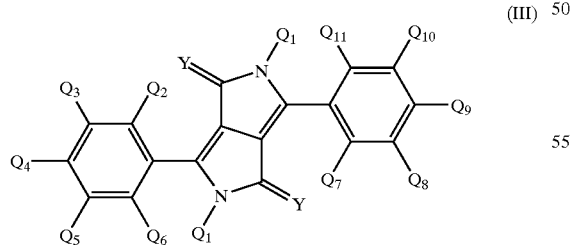

(III)

wherein Y represents an oxygen atom or a sulfur atom, $Q_1$ represents a hydrogen atom, a methyl group, an ethyl group or a phenyl group which may have a substituent, $Q_2$ to $Q_{11}$ each independently represents a hydrogen atom, a halogen atom, a cyano group, a nitro group, a sulfonic acid group, or an alkyl group having from 1 to 5 carbon atoms, which may have a substituent.

(2) The photosensitive composition as described in (1) above, wherein the compound of undergoing a reaction with at least one of a radical and an acid to change at least one of its physical and chemical properties and maintaining the changed physical or chemical property and is an addition-polymerizable compound having an ethylenically unsaturated double bond.

(3) The photosensitive composition as described in (1) above further comprising a binder polymer comprising an aqueous alkali-soluble or swellable linear organic polymer.

(4) The photosensitive composition as described in (3) above, wherein the aqueous alkali-soluble or swellable linear organic polymer is a urethane resin having an alkali-soluble group.

(5) The photosensitive composition as described in (1) above further comprising an oxime ether compound as a co-sensitizer.

(6) A photosensitive composition comprising (i) a sensitizing dye represented by the following formula (I), (II) or (III), (ii) a titanocene compound and (iii) a radical-polymerizable compound having an ethylenically unsaturated double bond:

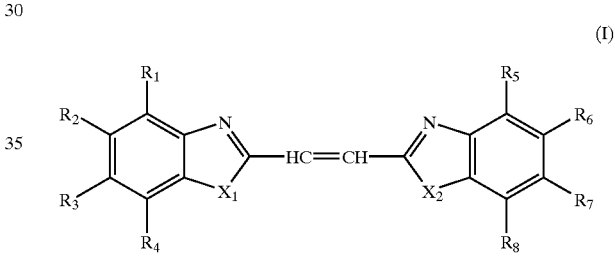

(I)

wherein $R_1$ to $R_8$ each independently represents a hydrogen atom, a halogen atom, a substituted or unsubstituted alkyl, alkoxy, alkylthio, aryloxy, arylthio, alkenyl, aralkyl, acyl, aryl, heteroaryl or alkylsulfonic acid group having 20 or less carbon atoms, and $X_1$ and $X_2$ each independently represents an oxygen atom or a sulfur atom;

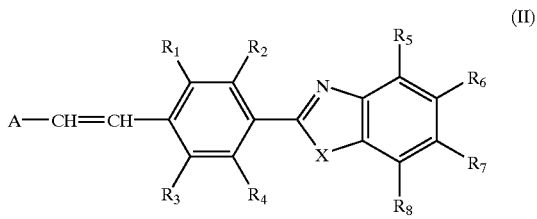

(II)

wherein $R_1$ to $R_8$ each independently represents a hydrogen atom, a halogen atom, a substituted or unsubstituted alkyl, alkoxy, alkylthio, aryloxy, arylthio, alkenyl, aralkyl, acyl, aryl, heteroaryl or alkylsulfonic acid group having 20 or less carbon atoms, X represents an oxygen atom or a sulfur atom, and A represents a substituted or unsubstituted aryl or heteroaryl group having 20 or less carbon atoms;

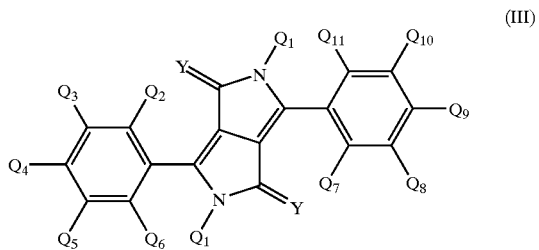

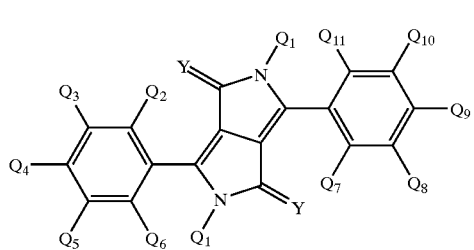

wherein Y represents an oxygen atom or a sulfur atom, $Q_1$ represents a hydrogen atom, a methyl group, an ethyl group or a phenyl group which may have a substituent, $Q_2$ to $Q_{11}$ each independently represents a hydrogen atom, a halogen atom, a cyano group, a nitro group, a sulfonic acid group, or an alkyl group having from 1 to 5 carbon atoms, which may have a substituent.

(7) The photosensitive composition as described in (6) above fu her comprising a binder polymer comprising an aqueous alkali-soluble or swellable linear organic polymer.

(8) A photosensitive lithographic printing plate comprising a support and a photosensitive layer comprising (i) a sensitizing dye represented by the following formula (I), (II) or (III), (ii) a titanocene compound and (iii) a compound of undergoing a reaction with at least one of a radical and an acid to change at least one of its physical and chemical properties and maintaining the changed physical or chemical property:

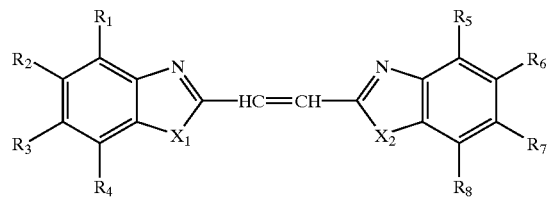

wherein $R_1$ to $R_8$ each independently represents a hydrogen atom, a halogen atom, a substituted or unsubstituted alkyl, alkoxy, alkylthio, aryloxy, arylthio, alkenyl, aralkyl, acyl, aryl, heteroaryl or alkylsulfonic acid group having 20 or less carbon atoms, and $x_1$ and $X_2$ each independently represents an oxygen atom or a sulfur atom;

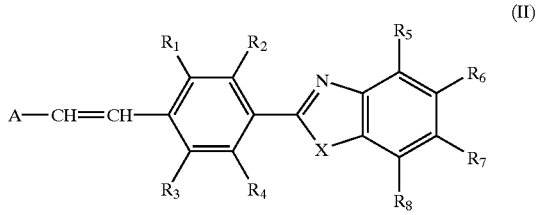

wherein $R_1$ to $R_8$ each independently represents a hydrogen atom, a halogen atom, a substituted or unsubstituted alkyl, alkoxy, alkylthio, aryloxy, arylthio, alkenyl, aralkyl, acyl, aryl, heteroaryl or alkylsultonic acid group having 20 or less carbon atoms, X represents an oxygen atom or a sulfur atom, and A represents a substituted or unsubstituted aryl or heteroaryl group having 20 or less carbon atoms;

wherein Y represents an oxygen atom or a sulfur atom, $Q_1$ represents a hydrogen atom, a methyl group, an ethyl group or a phenyl group which may have a substituent, $Q_2$ to $Q_{11}$ each independently represents a hydrogen atom, a halogen atom, a cyano group, a nitro group, a sulfonic acid group, or an alkyl group having from 1 to 5 carbon atoms, which may have a substituent.

(9) The photosensitive lithographic printing plate as described in (8) above, wherein the compound of undergoing a reaction with at least one of a radical and an acid to change at least one of its physical and chemical properties and maintaining the changed physical or chemical property and is an addition-polymerizable compound having an ethylenically unsaturated double bond.

(10) The photosensitive lithographic printing plate as described in (8) above, wherein the photosensitive layer further comprising a binder poly comprising an aqueous alkali-soluble or swellable linear organic polymer.

(11) The photosensitive lithographic printing plate as described in (10) above, wherein the aqueous alkali-soluble or swellable linear organic polymer is a urethane resin having an alkali-soluble group.

(12) The photosensitive lithographic printing plate as described in (8) above further comprising a protective layer containing polyvinyl alcohol.

(13) A photopolymerization method comprising exposing the photosensitive composition described in (1) above with a laser beam having a wavelength of 450 nm or less.

(14) A method of preparing a lithographic printing plate comprising exposing the photosensitive lithographic printing plate as described in (8) above with a laser beam having a wavelength of 450 nm or less and developing the exposed photosensitive lithographic printing plate with an aqueous alkali developing solution.

(15) The method of preparing a lithographic printing plate as described in (14) above, wherein the aqueous alkali developing solution has a pH of from 9.5 to 14.0.

(16) The method of preparing a lithographic printing plate as described in (14) above, wherein the exposure of the photosensitive lithographic printing plate is conducted using a laser beam having an exposure wavelength in a range of from 390 to 430 nm.

The lithographic printing plate precursor using the photosensitive composition of the present invention has sufficiently high sensitivity suitable for the scanning exposure by a short wavelength semiconductor laser such as InGaN and gives a lithographic printing plate excellent in the press life and scumming resistance. The lithographic printing plate precursor for scanning exposure of the present invention is remarkably improved in the fogging under a yellow lamp and therefore, the workability of handling the plate can be greatly improved. Furthermore, the photosensitive composition of the present invention has excellent sensitivity and at the same time, has very excellent storage stability.

DETAILED DESCRIPTION OF THE INVENTION

The present invention is described in detail below.

The photosensitive composition of the present invention comprises, as essential components, (A) a photopolymerization initiation system and (B) a compound of undergoing a reaction with at least one of a radical and an acid to change at least one of its physical and chemical properties and maintaining the changed physical or chemical property and, if desired, further comprises (C) a binder polymer. These components are specifically described below.

(A) Photopolymerization Initiation System

The photopolymerization initiation system as an essential component of the photosensitive composition of the present invention contains (I) a sensitizing dye having a specific structure and (II) a titanocene compound. In the initiation system of the present invention, the sensitizing dye mainly absorbs light to accelerate the generation of an initiating radical from the titanocene compound present together (such a process is hereinafter referred to as "dye sensitization"). One of the reasons why the sensitizing dye of the present invention is particularly excellent is in that its absorption wavelength is present in the region from 350 to 450 nm. Most of titanocene compounds described later each itself has weak absorption in the wavelength region from ultraviolet to the vicinity of 500 nm and has photosensitivity also in that region. However, the sensitizing dye having a specific structure of the present invention greatly elevates the photosensitivity of titanocene. Therefore, for example, by using a titanocene compound in a relatively small amount, the photosensitivity in the short wavelength region can be satisfactorily elevated and at the same time, the photosensitivity by titanocene itself in the region of 500 nm can be made low, as a result, safelight aptitude can be improved.

The reason why the sensitizing dye having a specific structure according to the present invention has particularly excellent dye sensitization property cannot be specifically described because the mechanism of dye sensitization is not clear, but can be considered as follows. The sensitizing dye of the present invention exhibits a high-intensity light emission (fluorescence and/or phosphorescence) spectrum and from the fact it is considered, as one possibility, that the sensitizing dye having the above-described partial structure has a relatively long life in the excited state and thus, acts to allow the reaction with the activator to efficiently proceed.

It has been also found that the sensitizing dye having a specific structure according to the present invention exhibits particularly excellent preservation stability in case of using together with the titanocene compound. Although the reason for improvement in the preservation stability is not definitely understood, it is presumed that the nitrogen atom included in the heterocyclic structure of sensitizing dye according to the present invention may cause some type interaction with the titanocene compound and as a result, compatibility of these compounds in the photosensitive layer is increased.

(A1) Sensitizing Dye

The sensitizing dye for use in the present invention is represented by the following formula (I), (II) or (III):

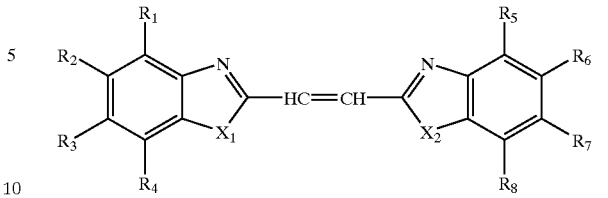

(I)

wherein $R_1$ to $R_8$ each independently represents a hydrogen atom, a halogen atom, a substituted or unsubstituted alkyl, alkoxy, alkylthio, aryloxy, arylthio, alkenyl, aralkyl, acyl, aryl, heteroaryl or alkylsulfonic acid group having 20 or less carbon atoms, and $X_1$ and $X_2$ each independently represents an oxygen atom or a sulfur atom;

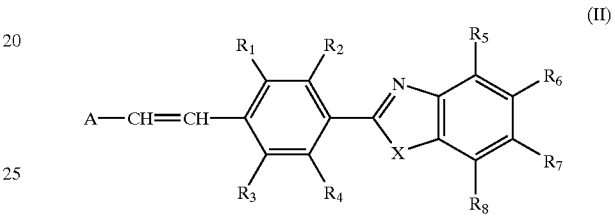

(II)

wherein $R_1$ to $R_8$ each independently represents a hydrogen atom, a halogen atom, a substituted or unsubstituted alkyl, alkoxy, alkylthio, aryloxy, arylthio, alkenyl, aralkyl, acyl, aryl, heteroaryl or alkylsulfonic acid group having 20 or less carbon atoms, X represents an oxygen atom or a sulfur atom, and A represents a substituted or unsubstituted aryl or heteroaryl group having 20 or less carbon atoms;

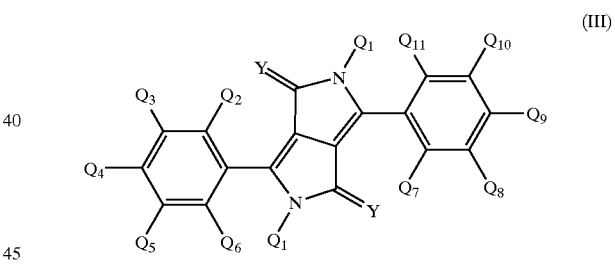

(III)

wherein Y represents an oxygen atom or a sulfur atom, $Q_1$ represents a hydrogen atom, a methyl group, an ethyl group or a phenyl group which may have a substituent, $Q_2$ to $Q_{11}$ each independently represents a hydrogen atom, a halogen atom, a cyano group, a nitro group, a sulfonic acid group, or an alkyl group having from 1 to 5 carbon atoms, which may have a substituent.

Formula (I) is described in detail below. Specific examples of $R_1$ to $R_8$ are described below.

Specific examples of the halogen atom include a fluorine atom, a chlorine atom, a bromine atom and an iodine atom.

Specific examples of the substituted or unsubstituted alkyl group include a linear, branched or cyclic alkyl group, an alkoxyalkyl group, an alkoxyalkoxyalkyl group, an alkoxyalkoxyalkoxyalkyl group, an alkoxycarbonylalkyl group, an alkoxycarbonyloxyalkyl group, an alkoxyalkoxycarbonyloxyalkyl group, a hydroxyalkyl group, a hydroxyalkoxyalkyl group, a hydroxyalkoxyalkoxyalkyl group, a cyanoalkyl group, an acyloxyalkyl group, an acyloxyalkoxyalkyl group, an acyloxyalkoxyalkoxyalkyl group, a halogenated alkyl group, a sulfonalkyl group, an alkylcarbonylaminoalkyl group, an alkylsulfonaminoalkyl group, a sulfonamidoalkyl group, an alkylaminoalkyl group, an aminoalkyl group and an alkylsulfonalkyl group.

Examples of the linear, branched or cyclic alkyl group include, on taking account of processability by the coating on a polycarbonate, acryl, epoxy or polyolefin substrate, a methyl group, an ethyl group, an n-propyl group, an iso-propyl group, an n-butyl group, an iso-butyl group, a sec-butyl group, a tert-butyl group, an n-pentyl group, an iso-pentyl group, a 2-methylbutyl group, a 1-methylbutyl group, a neopentyl group, a 1,2-dimethylpropyl group, a 1,1-dimethylpropyl group, a cyclopentyl group, an n-hexyl group, 4-methylpentyl group, a 3-methylpentyl group, a 2-methylpentyl group, a 1-methylpentyl group, a 3,3-dimethylbutyl group, a 2,3-dimethylbutyl group, a 1,3-dimethylbutyl group, a 2,2-dimethylbutyl group, a 1,2-dimethylbutyl group, a 1,1-dimethylbutyl group, a 3-ethylbutyl group, a 2-ethylbutyl group, a 1-ethylbutyl group, a 1,2,2-trimethylbutyl group, a 1,1,2-trimethylbutyl group, a 1-ethyl-2-methylpropyl group, a cyclo-hexyl group, an n-heptyl group, a 2-methylhexyl group, a 3-methylhexyl group, a 4-methylhexyl group, a 5-methylhexyl group, a 2,4-dimethylpentyl group, an n-octyl group, a 2-ethylhexyl group, a 2,5-dimethylhexyl group, a 2,5,5-trimethylpentyl group, a 2,4-dimethylhexyl group, a 2,2,4-trimethylpentyl group, a 3,5,5-trimethylhexyl group, an n-nonyl group, an n-decyl group, a 4-ethyloctyl group, a 4-ethyl-4,5-methylhexyl group, an n-undecyl group, an n-dodecyl group, a 1,3,5,7-tetraethyloctyl group, 4-butyloctyl group, a 6,6-diethyloctyl group, an n-tridecyl group, a 6-methyl-4-butyloctyl group, an n-tetradecyl group, an n-pentadecyl group, a 3,5-dimethylheptyl group, a 2,6-dimethylheptyl group, a 2,4-dimethylheptyl group, a 2,2,5,5-tetramethylhexyl group, a 1-cyclopentyl-2,2-dimethylpropyl group and a 1-cyclohexyl-2,2-dimethylpropyl group.

Examples of the alkoxyalkyl group include a methoxymethyl group, an ethoxymethyl group, a propoxymethyl group, a butoxymethyl group, a methoxyethyl group, an ethoxyethyl group, a propoxyethyl group, a butoxyethyl group, an n-hexyloxyethyl group, a 4-methylpentoxyethyl group, a 1,3-dimethylbutoxyethyl group, a 2-ethylhexyloxyethyl group, an n-octyloxyethyl group, a 3,5,5-trimethylhexyloxyethyl group, a 2-methyl-1-iso-propylpropoxyethyl group, a 3-methyl-1-iso-propylbutyloxyethyl group, a 2-ethoxy-1-methylethyl group, a 3-methoxybutyl group, a 3,3,3-trifluoropropoxyethyl group and a 3,3,3-trichloropropoxyethyl group.

Examples of the alkoxyalkoxyalkyl group include a methoxyethoxyethyl group, an ethoxyethoxyethyl group, a propoxyethoxyethyl group, a butoxyethoxyethyl group, a hexyloxyethoxyethyl group, a 1,2-dimethylpropoxyethoxyethyl group, a 3-methyl-1-iso-butylbutoxyethoxyethyl group, a 2-methoxy-1-methylethoxyethyl group, a 2-butoxy-1-methylethoxyethyl group, a 2-(2'-ethoxy-1'-methylethoxy)-1-methylethyl group, a 3,3,3-trifluoropropoxyethoxyethyl group and a 3,3,3-trichloropropoxyethoxyethyl group.

Examples of the alkoxyalkoxyalkoxyalkyl group include a methoxyethoxyethoxyethyl group, an ethoxyethoxyethoxyethyl group, a butoxyethoxyethoxyethyl group, a 2,2,2-trifluoroethoxyethoxyethoxyethyl group and a 2,2,2-trichloroethoxyethoxyethoxyethyl group.

Examples of the alkoxycarbonylalkyl group include a methoxycarbonylmethyl group, an ethoxycarbonylmethyl group, a butoxycarbonylmethyl group, a 2,2,3,3-tetrafluoropropoxycarbonylmethyl group and a 2,2,3,3-tetrachloropropoxycarbonylmethyl group.

Examples of the alkoxycarbonyloxyalkyl group include a methoxycarbonyloxyethyl group, an ethoxycarbonyloxyethyl group, a butoxycarbonyloxyethyl group, a 2,2,2-trifluoroethoxycarbonyloxyethyl group and a 2,2,2-trichloroethoxycarbonyloxyethyl group.

Examples of the alkoxyalkoxycarbonyloxyalkyl group include a methoxyethoxycarbonyloxyethyl group, an ethoxyethoxycarbonyloxyethyl group, a butoxyethoxycarbonyloxyethyl group, a 2,2,2-trifluoroethoxyethoxycarbonyloxyethyl group and a 2,2,2-trichloroethoxyethoxycarbonyloxyethyl group.

Examples of the hydroxyalkyl group include a 2-hydroxyethyl group, a 4-hydroxyethyl group, a 2-hydroxy-3-methoxypropyl group, a 2-hydroxy-3-chloropropyl group, a 2-hydroxy-3-ethoxypropyl group, a 3-butoxy-2-hydroxypropyl group, a 2-hydroxy-3-phenoxypropyl group, a 2-hydroxypropyl group and a 2-hydroxybutyl group.

Examples of the hydroxyalkoxyalkyl group include a hydroxyethoxyethyl group, a 2-(2'-hydroxy-1'-methylethoxy)-1-methylethyl group, a 2-(3'-fluoro-2'-hydroxypropoxy)ethyl group and 2-(3'-chloro-2'-hydroxypropoxy)ethyl group.

Examples of the hydroxyalkoxyalkoxyalkyl group include a hydroxyethoxyethoxyethyl group, a [2'-(2'-hydroxy-1'-methylethoxy)-1'-methylethoxy]ethoxyethyl group, a [2'-(2'-fluoro-1'-hydroxyethoxy)-1'-methylethoxy]-ethoxyethyl group and [2'-(2'-chloro-1'-hydroxyethoxy)-1'-methylethoxy]ethoxyethyl group.

Examples of the cyanoalkyl group include a 2-cyanoethyl group, a 4-cyanobutyl group, a 2-cyano-3-methoxypropyl group, a 2-cyano-3-chloropropyl group, a 2-cyano-3-ethoxypropyl group, a 3-butoxy-2-cyanopropyl group, a 2-cyano-3-phenoxypropyl group, a 2-cyanopropyl group and a 2-cyanobutyl group.

Examples of the acyloxyalkyl group include an acetoxyethyl group, a propionyloxyethyl group, a butyryloxyethyl group, a valeryloxyethyl group, a 1-ethylpentylcaronyloxyethyl group, a 2,4,4-trimethylpentylcarbonyloxyethyl group, a 3-fluorobutyryloxyethyl group and a 3-chlorobutyryloxyethyl group.

Examples of the acyloxyalkoxyalkyl group include an acetoxyethoxyethyl group, a propionyloxyethoxyethyl group, a valeryloxyethoxyethyl group, a 1-ethylpentylcaronyloxyethoxyethyl group, a 2,4,4-trimethylpentylcarbonyloxyethoxyethyl group, a 2-fluoropropionyloxyethoxyethyl group and a 2-chloropropionyloxyethoxyethyl group.

Examples of the acyloxyalkoxyalkoxyalkyl group include an acetoxyethoxyethoxyethyl group, a propionyloxyethoxyethoxyethyl group, a valeryloxyethoxyethoxyethyl group, a 1-ethylpentylcarbonyloxyethoxyethoxyethyl group, a 2,4,4-trimethylpentylcarbonyloxyethoxyethoxyethyl group, a 2-fluoropropionyloxyethoxyethoxyethyl group and a 2-chloropropionyloxyethoxyethoxyethyl group.

Examples of the halogenated alkyl group include a chloromethyl group, a chloroethyl group, a 2,2,2-trifluoroethyl group, a trifluoromethyl group, a bromomethyl group and iodomethyl group.

Examples of the sulfone alkyl group include a sulfone methyl group, a sulfone ethyl group and a sulfone propyl group.

Examples of the alkylcarbonylaminoalkyl group include methylcarbonylaminoethyl group, an ethylcarbonylaminoethyl group, a propylcarbonylaminoethyl group, a cyclohexylcarbonylaminoethyl group and a succiniminoethyl group.

Examples of the alkylsulfonaminoalkyl group include a methylsulfonaminoethyl group, an ethylsulfonaminoethyl group and a propylsulfonaminoethyl group.

Examples of the sulfonamidoalkyl group include a sulfonamidomethyl group, a sulfonamidoethyl group and a sulfonamidopropyl group.

Examples of the alkylaminoalkyl group include an N-methylaminomethyl group, an N,N-dimethylaminomethyl group, an N,N-diethylaminomethyl group, an N,N-dipropylaminomethyl group and an N,N-dibutylaminomethyl group.

Examples of the aminoalkyl group include an aminomethyl group, an aminoethyl group and an aminopropyl group.

Examples of the alkylsulfone alkyl group include a methylsulfone methyl group, an ethylsulfone methyl group, a butylsulfone methyl group, a methylsulfone ethyl group, an ethylsulfone ethyl group, a butylsulfone ethyl group, a 2,2,3,3-tetrafluoropropylsulfone methyl group and a 2,2,3,3-tetrachloropropylsulfone methyl group.

Examples of the substituted or unsubstituted alkoxy group include alkoxy groups having a substituent similar to those described above for the alkyl group. Preferred examples thereof include lower alkoxy groups such as a methoxy group, an ethoxy group, an n-propoxy group, an iso-propoxy group, an n-butoxy group, an iso-butoxy group, a sec-butoxy group, a tert-butoxy group, an n-pentoxy group, an iso-pentoxy group, a neopentoxy group and a 2-methylbutoxy group.

Examples of the substituted or unsubstituted acyl group include acyl groups having a substituent similar to those described above for the alkyl group. Preferred examples thereof include a formyl group, a methylcarbonyl group, an ethylcarbonyl group, an n-propylcarbonyl group, an iso-propylcarbonyl group, an n-butylcarbonyl group, an iso-butylcarbonyl group, a sec-butylcarbonyl group, a tert-butylcarbonyl group, an n-pentylcarbonyl group, an iso-pentylcarbonyl group, a neopentylcarbonyl group, a 2-methylbutylcarbonyl group and a nitrobenzylcarbonyl group.

Examples of the substituted or unsubstituted aryl group include aryl groups having a substituent similar to those described above for the alkyl group. Preferred examples thereof include a phenyl group, a nitrophenyl group, a cyanophenyl group, a hydroxyphenyl group, a methylphenyl group, a trifluoromethylphenyl group, a naphthyl group, a nitronaphthyl group, a cyanonaphthyl group, a hydroxynaphthyl group, a methylnaphthyl group and a trifluoromethylnaphthyl group.

Examples of the substituted or unsubstituted aralkyl group include aralkyl groups having a substituent similar to those described above for the alkyl group. Preferred examples thereof include a benzyl group, a nitrobenzyl group, a cyanobenzyl group, a hydroxybenzyl group, a methylbenzyl group, a trifluoromethylbenzyl group, a naphthylmethyl group, a nitronaphthylmethyl group, a cyanonaphthylmethyl group, a hydroxynaphthylmethyl group, a methylnaphthylmethyl group and a trifluoromethylnaphthylmethyl group.

Examples of the substituted or unsubstituted alkenyl group include alkenyl groups having a substituent similar to those described above for the alkyl group. Preferred examples thereof include lower alkenyl groups such as propenyl group, 1-butenyl group, iso-butenyl group, 1-pentenyl group, 2-pentenyl group, 2-methyl-1-butenyl group, 3-methyl-1-butenyl group, 2-methyl-2-butenyl group, 2,2-dicyanovinyl group, 2-cyano-2-methylcarboxy vinyl group and 2-cyano-2-methylsulfone vinyl group.

Examples of the substituted or unsubstituted alkylthio group include alkylthio groups having a substituent similar to those described above for the alkyl group. Preferred examples thereof include lower alkylthio groups such as methylthio group, ethylthio group, an n-propylthio group, an iso-propylthio group, an n-butylthio group, an iso-butylthio group, a sec-butylthio group, a tert-butylthio group, an n-pentylthio group, an iso-pentylthio group, a neopentylthio group, a 2-methylbutylthio group and a methylcarboxylethylthio group.

Examples of the substituted or unsubstituted aryloxy group include aryloxy groups having a substituent similar to those described above for the aryl group. Preferred examples thereof include a phenoxy group, a 2-methylphenoxy group, a 4-methylphenoxy group, a 4-tert-butylphenoxy group, a 2-methoxyphenoxy group and a 4-iso-propylphenoxy group.

Examples of the substituted or unsubstituted arylthio group include arylthio groups having a substituent similar to those described above for the aryl group. Preferred examples thereof include a phenylthio group, a 4-methylphenylthio group, a 2-methoxyphenylthio group and a 4-tert-butylphenylthio group.

Examples of the substituted or unsubstituted heteroaryl group include a pyrrolyl group, a thienyl group, a furanyl group, an oxazoyl group, an isooxazoyl group, an oxadiazoyl group, an imidazoyl group, a benzoxazoyl group, a benzothiazoyl group, a benzimidazoyl group, a benzofuranyl group and an indoyl group.

Examples of the substituted or unsubstituted alkylsulfone group include alkylsulfone groups having a substituent similar to those described above for the alkyl group. Preferred examples thereof include a methylsulfone group, an ethylsulfone group, an n-propylsulfone group, an iso-propylsulfone group, an n-butylsulfone group, an iso-butylsulfone group, a sac-butylsulfone group, a tert-butylsulfone group, an n-pentylsulfone group, an iso-butylsulfone group, a neopentylsulfone group, a 2-methylbutylsulfone group, a 2-hydroxyethylsulfone group and a 2-cyanoethylsulfone group.

The compound represented by formula (I) of the present invention can be easily produced according to a known method described, for example, in *J. Am. Chem. Soc.*, 63, 3203 (1941). More specifically, the compound represented by formula (I) can be produced by reacting a compound represented by formula (I-2) with a compound represented by formula (I-3) using a hydrochloric acid as a catalyst.

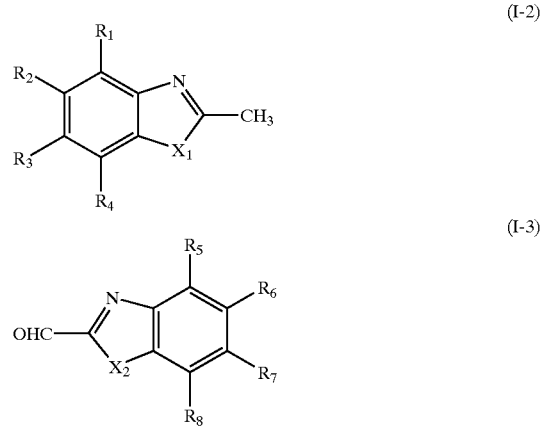

In formulae (I-2) and (I-3), $R_1$ to $R_8$, $X_1$ and $X_2$ have the same meanings as defined above, respectively.

Specific examples of the compound represented by formula (I) are shown in Table 1A.

TABLE 1A

| Compound | X₁ | R₁ | R₂ | R₃ | R₄ | X₂ | R₅ | R₆ | R₇ | R₈ |
|---|---|---|---|---|---|---|---|---|---|---|
| D-1 | O | H | H | H | H | O | H | H | H | H |
| D-2 | O | H | —CH₃ | H | H | O | H | —CH₃ | H | H |
| D-3 | S | H | H | H | H | S | H | H | H | —O—iPr |
| D-4 | O | —O—iPr | H | Br | —O—iPr | O | —O—iPr | H | Br | H |
| D-5 | S | Cl | H | H | H | S | Cl | —CH₃ | —CH₃ | H |
| D-6 | O | H | —CH₃ | —CH₃ | —SC₂H₅ | O | —SC₂H₅ | H | H | —SC₂H₅ |
| D-7 | O | —SC₂H₅ | H | —SO₂C₂H₅ | H | O | H | —CH=CHCH₃ | —SO₂C₂H₅ | H |
| D-8 | O | H | H | H | H | S | H | H | —CH₂CN | H |
| D-9 | S | H | —CH=CHCH₃ | —CH₂CN | H | O | H | H | H | H |
| D-10 | O | H | H | H | H | O | H | H | H | H |
| D-11 | S | 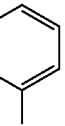 | H | H | H | S | 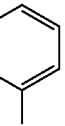 | H | H | H |
| D-12 | O | H |  |  | H | O | H |  |  | H |
| D-13 | S | H |  | H | H | S | H | H | —CH₃ | H |
| D-14 | S |  | H |  | H | S |  | H | H | H |
| D-15 | O | H | —COC₂H₅ | H | H | O | H | —COC₂H₅ | H | H |
| D-16 | S | —CH₃ | H | H | —CH₃ | S | —CH₃ | H | H | —CH₃ |
| D-17 | S | H | H | H | H | S | H | H | H | —C₂H₅ |
| D-18 | O | H | —CH₃ | H | H | O | H | —CH=CHCH₃ | 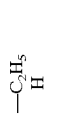 | H |

TABLE 1A-continued

| Compound | X₁ | R₁ | R₂ | R₃ | R₄ | X₂ | R₅ | R₆ | R₇ | R₈ |
|---|---|---|---|---|---|---|---|---|---|---|
| D-19 | O | H |  (4-methylbenzyl) |  (4-methylphenyl) | H | S | Cl | H | H | H |
| D-20 | O |  (methoxyphenyl) | H | H | H | S | H | 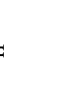 (2-methylfuryl) | —CH₃ | H |
| D-21 | S | H | H | —CH=CHCH₃ | H | S | H | H | —CH₂CN | H |
| D-22 | O | H | H | —SO₂C₂H₅ | H | O | —SC₂H₅ | H | H | —SC₂H₅ |
| D-23 | O | H | H | —CH₃ | H | S | H |  (2-methylfuryl) | —CH₃ | H |
| D-24 | O | H | Br | Br | H | O | H |  (di-(4-methylphenyl)methyl) | H | H |
| D-25 | O | H | H | H | H | S |  (3,5-dimethylphenylthio) | H | H | H |
| D-26 | O | H | —COC₂H₅ | H | H | S | —CH₃ | H |  (benzyl) | —CH₃ |
| D-27 | O | 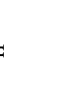 (methoxyphenyl) | —iPr | —iPr | H | O | H | —SO₂C₂H₅ | —SO₂C₂H₅ | H |

TABLE 1A-continued

| Compound | X₁ | R₁ | R₂ | R₃ | R₄ | X₂ | R₅ | R₆ | R₇ | R₈ |
|---|---|---|---|---|---|---|---|---|---|---|
| D-28 | S | 3,5-di(CH₃)-C₆H₃-S- | H | H | H | S | H | Cl | Cl | H |
| D-29 | O | —SC₂H₅ | —CH₃ | —CH₃ | —SC₂H₅ | S | H | 4-CH₃-C₆H₄-CH(4-CH₃-C₆H₄)- | | H |
| D-30 | O | H | 2,5-di(CH₃)-thiophen-3-yl | —CH₃ | H | O | —C₂H₅ | H | H | —C₂H₅ |

The compound represented by formula (II) is described in detail below.

Specific examples of each substituent represented by $R_1$ to $R_8$ are the same as the specific examples of $R_1$ to $R_8$ in formula (I).

Specific examples of the substituted or unsubstituted aryl group and the substituted or unsubstituted heteroaryl group represented by A are the same as the specific examples of the substituted or unsubstituted aryl group and the substituted or unsubstituted heteroaryl group represented by $R_1$ to $R_8$.

The compound represented by formula (II) of the present invention can be easily produced according to a known method described, for example, in *J. Am. Chem. Soc.*, 63, 3203 (1941). More specifically, the compound represented by formula (II) can be produced by reacting a compound represented by formula (II-2) with a compound represented by formula (II-3) using a hydrochloric acid as a catalyst.

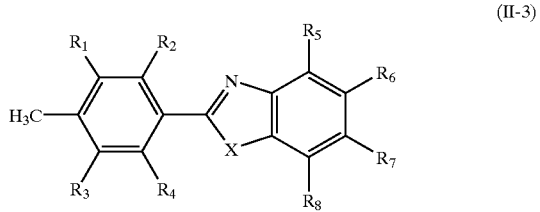

(II-3)

In formulae (II-2) and (II-3), $R_1$ to $R_8$, $X_1$ and $X_2$ have the same meanings as defined above, respectively.

Specific examples of the compound represented by formula (II) are shown in Table 1B.

TABLE 1B
| Compound | A | X | R₁ | R₂ | R₃ | R₄ | R₅ | R₆ | R₇ | R₈ |
|---|---|---|---|---|---|---|---|---|---|---|
| D-II-1 | 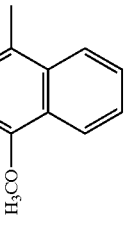 | O | H | H | H | H | H | H | H | H |
| D-II-2 | 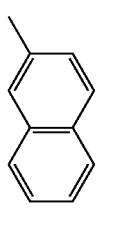 | O | H | H | H | H | H | H | H | H |
| D-II-3 | 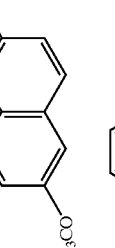 | O | H | H | H | H | H | H | H | H |
| D-II-4 | 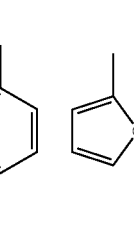 | O | H | H | H | H | H | H | H | H |
| D-II-5 | 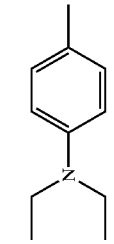 | S | H | CH₃ | H | CH₃ | H | Br | Br | H |
| D-II-6 | 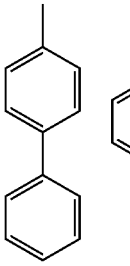 | O | —OCH₃ | H | H | —OCH₃ | i-Pr | H | H | i-Pr |
| D-II-7 | 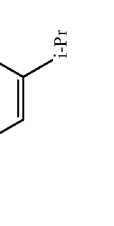 | S | H | H | H | H | H | —SO₂C₂H₅ | H | H |
| D-II-8 |  | S | —CH₂— ⌬ | H | H | H | H | H | H | H |

TABLE 1B-continued
| Compound | A | X | R₁ | R₂ | R₃ | R₄ | R₅ | R₆ | R₇ | R₈ |
|---|---|---|---|---|---|---|---|---|---|---|
| D-II-9 |  | O | H | H | H | H | —S-t-Bu | H | H | —S-t-Bu |
| D-II-10 |  | S |  | H | H | H | H | —COCH₃ | H | H |
| D-II-11 |  | O | H | H | H | H | H | H | —CH=CHCH₃ | H |
| D-II-12 |  | O | H | Br | H | Br | H | H | H | H |
| D-II-13 |  | S | H | H | H | H | —CH₂CN |  | H | H |
| D-II-14 |  | O | C₂H₅ |  | C₂H₅ | H | H | H | H | H |
| D-II-15 |  | O | H | H | H | H | H | H | H | H |
| D-II-16 |  | S | H | H | H | H | Cl | H | H | Cl |

TABLE 1B-continued
| Compound | A | X | $R_1$ | $R_2$ | $R_3$ | $R_4$ | $R_5$ | $R_6$ | $R_7$ | $R_8$ |
|---|---|---|---|---|---|---|---|---|---|---|
| D-II-17 |  | S | H | $CO_2C_2H_5$ | H | H | H | H |  | H |
| D-II-18 |  | O | Cl | H | H | H | H |  | H | H |
| D-II-19 |  | S | H | H | H | H | H |  | H | H |
| D-II-20 |  | O | H | Br | Br | H | H | $OC_2H_5$ | $OC_2H_5$ | H |
| D-II-21 |  | O | H | $C_2H_5$ | $C_2H_5$ | H | H |  | H | H |
| D-II-22 |  | S | H | —CH=CHCH$_3$ | H | H | —CH$_3$CN | H | H | H |
| D-II-23 |  | S | H | Br | Br | H | Cl | H | H | Cl |

The compound represented by formula (III) is described in detail below.

Examples of the phenyl group having a substituent, represented by $Q_1$ include phenyl groups substituted by a halogen atom (e.g., fluorine, chlorine, bromine, iodine), a cyano group, a nitro group, a sulfonic acid group or the like. Examples of the alkyl group having from 1 to 5 carbon atoms which may have a substituent, represented by $Q_2$ to $Q_{11}$, include primary alkyl groups such as methyl group, ethyl group, n-propyl group, n-butyl group, isobutyl group, n-pentyl group, neopentyl group, isoamyl group and 2-methylbutyl group, secondary alkyl groups such as isopropyl group, sec-butyl group, 1-ethylpropyl group, 1-methylbutyl group and 1,2-dimethylpropyl group, tertiary alkyl groups such as tert-butyl group, and these alkyl groups substituted by fluorine, chlorine, bromine, iodine or the like.

Specific preferred examples of the compound represented by formula (III) include Compounds (D-III-1) to (D-III-18) shown below, however, the present invention is not limited thereto.

D-III-1
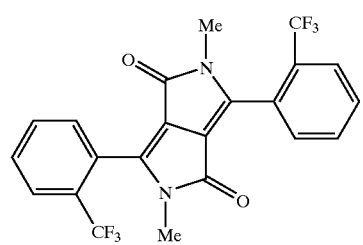

D-III-2
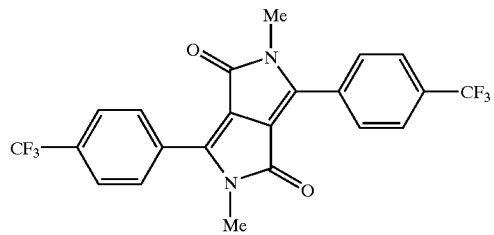

D-III-3
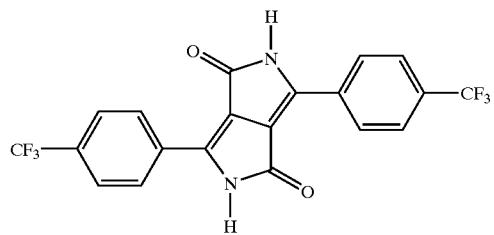

D-III-4
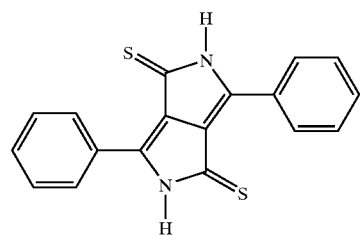

D-III-5
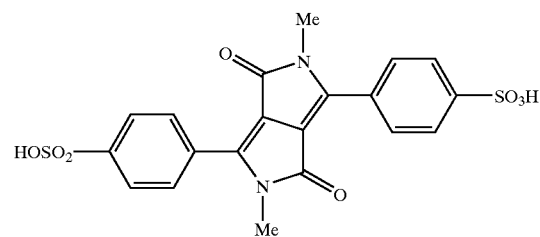

D-III-6
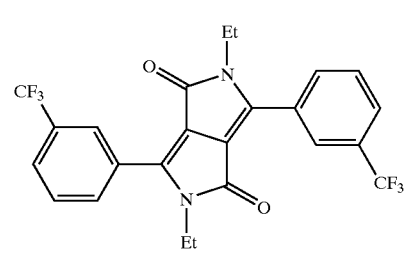

D-III-7
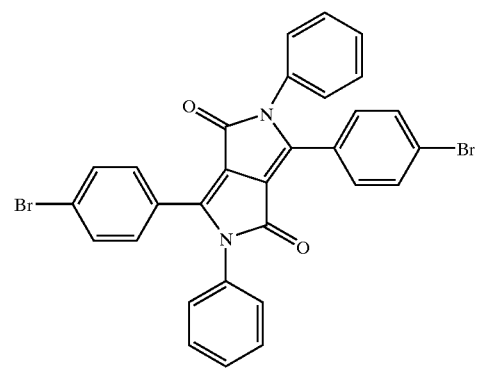

D-III-8
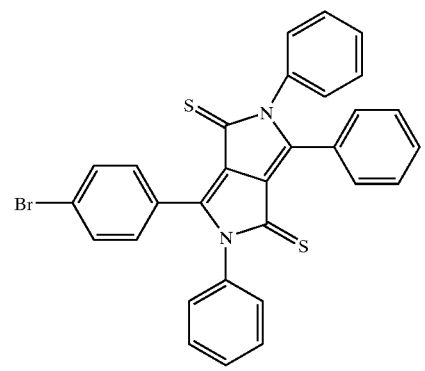

D-III-9
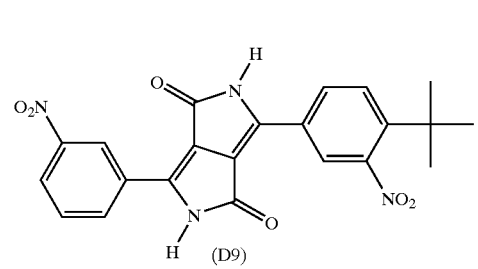

-continued

D-III-10
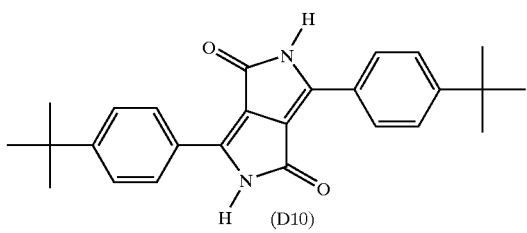

D-III-11
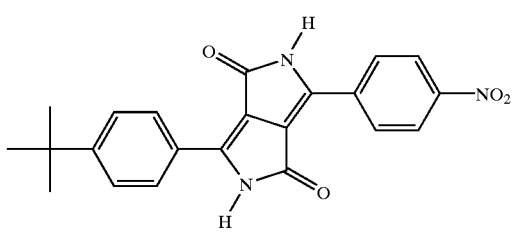

D-III-12
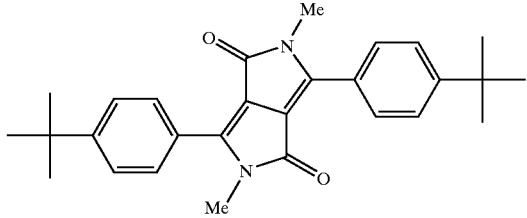

D-III-13
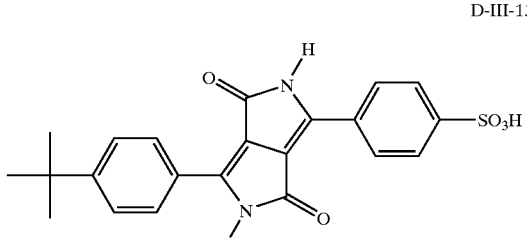

D-III-14
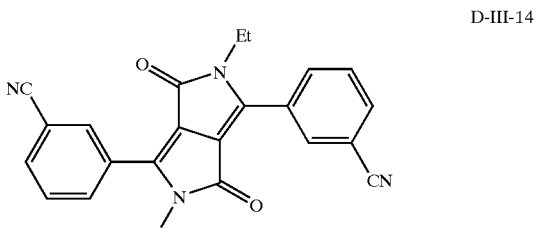

D-III-15
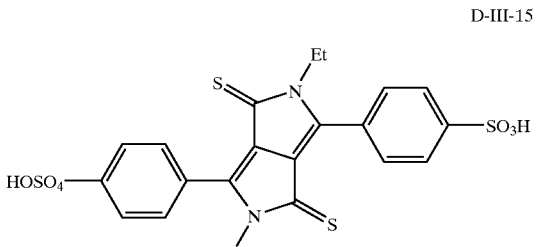

-continued

D-III-16
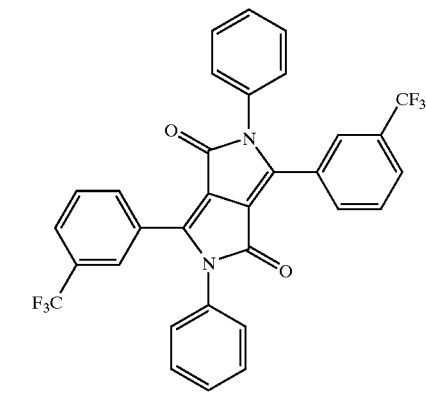

D-III-17
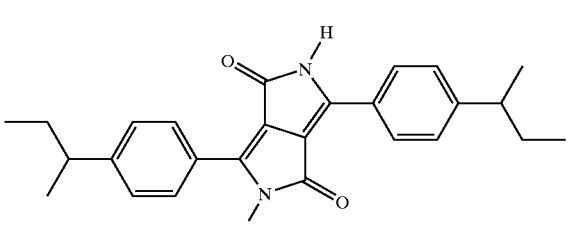

D-III-18
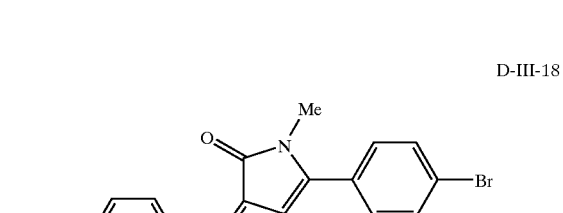

In order to improve the image forming properties, a compound having absorption maximum in the wavelength region of 350 to 550 nm and a large refractive index at 400 to 500 nm, other than the above-described compounds, may be mixed. Specific examples of such compound include cyanine compounds, squarylium-base compounds, naphthoquinone-base compounds, anthraquinone-base compounds, tetrapyraporphyrazine-base compounds, indophenol-base compounds, pyrylium-base compounds, thiopyrylium-base compounds, azulenium-base compounds, triphenylmethane-base compounds, xanthene-base compounds, indanthrene-base compounds, indigo-base compounds, thioindigo-base compounds, merocyanine-base compounds, thiazine-base compounds, acridine-base compounds, oxazine-base compounds and dipyrromethene-base compounds. A plurality of these compounds may be used as a mixture. The mixing ratio of such compound is approximately from 0.1 to 30%.

The sensitizing dye for use in the present invention may be subjected to various chemical modifications so that when it is used in a lithographic printing plate precursor, the properties of the photosensitive layer can be improved. For example, the sensitizing dye may be bound to an addition-polymerizable compound structure (e.g., acryloyl group, methacryloyl group) by a covalent bond, ionic bond, hydrogen bond or the like, whereby strength of the layer can be increased and unnecessary deposition of the dye in the layer after exposure can be inhibited. Also, the sensitizing dye may be bound to a titanocene compound described hereinafter or to other radical generation parts (for example, a reduction decomposable part such as halogenated alkyl, onium, peroxide, biimidazole, onium or biimidazole, or an oxidation cleavable part such as borate, amine, trimethylsilylmethyl, carboxymethyl, carbonyl or imine), whereby photosensitivity particularly under a low concentration condition of the initiation system can be remarkably increased.

Also, in case of using the photosensitive composition of the present invention for the preparation of a lithographic printing plate precursor, introduction of a hydrophilic site (an acidic group or a polar group, for example, a carboxyl group or an ester thereof, a sulfonic group or an ester thereof, or an ethylene oxide group) to the dye is effective for the purpose of enhancing the processing suitability with an (alkali) aqueous developer, which is a preferred use mode of the photosensitive layer. Particularly, an ester-type hydrophilic group has a feature in that it exhibits excellent compatibility in the photosensitive layer due to the relatively hydrophobic structure and in the developer, it is hydrolyzed to generate an acid radical, thereby increasing solubility. In addition, a substituent can be appropriately introduced, for example, for improving the compatibility or inhibiting the crystallization in the photosensitive layer. For example, in a certain kind of photosensitive system, an unsaturated bond of an aryl group, an allyl group or the like is sometimes very effective for improving the compatibility. Furthermore, the formation of a steric hindrance between a planes of dyes by a method such as introduction of a branched alkyl structure can significantly inhibit the crystallization. Also, adhesion to an inorganic material such as metal or metal oxide can be improved by the introduction of a phosphonic acid group, an epoxy group, a trialkoxysilyl group or the like. If desired, polymerization of the sensitizing dye may also be used.

Details of the use method of the sensitizing dye, such as selection of the structure, sole or combination use and amount added, can be appropriately selected in accordance with the designed performance of the final photosensitive material For example, when two or more sensitizing dyes are used in combination, the compatibility with the photosensitive composition layer can be increased. For the selection of sensitizing dye, the molar absorption coefficient at the emission wavelength of the light source used is an important factor in addition to the photosensitivity. Use of a dye having a large molar absorption coefficient is profitable, because the amount of dye added can be made relatively small. Also, in case of preparing a lithographic printing plate precursor, the use of such a dye is advantageous in view of the physical properties of the photosensitive layer. Since the photosensitivity and resolution of the photosensitive layer and the physical properties of the exposed layer are greatly affected by the absorbance at the wavelength of light source, the amount of the sensitizing dye added is appropriately selected by taking account of these factors. For example, the sensitivity decreases in the low absorbance region of 0.1 or less. Also, the resolution decreases due to the effect of halation.

However, for the purpose of hardening a coating having a large thickness of 5 μm or more, such low absorbance is sometimes rather effective in increasing the hardening degree. On the other hand, in the high absorbance region of 3 or more, the light is mostly absorbed on the surface of the photosensitive layer and hardening in more inner part is inhibited, as a result, when, for example, a printing plate is manufactured, the layer strength and the adhesion to substrate become insufficient. In the case of use as a lithographic printing plate where the layer has a relatively small thickness, the amount of the sensitizing dye added is preferably selected such that the photosensitive layer has an absorbance of 0.1 to 1.5, preferably from 0.25 to 1. In the case of use as a lithographic printing plate, the amount of the sensitizing dye added is usually from 0.05 to 30 parts by weight, preferably from 0.1 to 20 parts by weight, and more preferably from 0.2 to 10 parts by weight, per 100 parts by weight of the photosensitive layer components.

(A2) Titanocene Compound

The titanocene compound used as the photopolymerization initiation system in the present invention may be any titanocene compound insofar as it can generate an active radical upon irradiation with light in the copresence of the above-described sensitizing dye, and may be appropriately selected from known compounds described, for example, in JP-A-59-152396, JP-A-61-151197, JP-A-63-41483, JP-A-63-41484, JP-A-2-249, JP-A-2-291, JP-A-3-27393, JP-A-3-12403 and JP-A-6-41170.

Specific examples thereof include dicyclopentadienyl-Ti-dichloride, dicyclopentadienyl-Ti-bisphenyl, dicyclopentadienyl-Ti-bis-2,3,4,5,6-pentafluorophen-1-yl (hereinafter sometimes referred to as "T-1"), dicyclopentadienyl-Ti-bis-2,3,5,6-tetrafluorophen-1-yl, dicyclopentadienyl-Ti-bis-2,4,6-trifluorophen-1-yl, dicyclopentadienyl-Ti-bis-2,6-difluorophen-1-yl, dicyclopentadienyl-Ti-bis-2,4-difluorophen-1-yl, dimethylcyclopentadienyl-Ti-bis-2,3,4,5,6-pentafluorophen-1-yl, dimethylcyclopentadienyl-Ti-bis-2,3,5,6-tetrafluorophen-1-yl, dimethylcyclopentadienyl-Ti-bis-2,4-difluorophen-1-yl and bis(cyclopentadienyl)-bis(2,6-difluoro-3-(pir-1-yl)phenyl)titanium (hereinafter sometimes referred to as "T-2").

Similarly to the above-described sensitizing dye, the titanocene compound for use in the present invention may be subjected to various chemical modifications so that when a lithographic printing plate precursor is manufactured, the properties of the photosensitive layer can be improved. Examples of the method which can be used include binding with a sensitizing dye, an addition-polymerizable unsaturated compound or other radical generating part, introduction of a hydrophilic site, introduction of a substituent for improving the compatibility or inhibiting the crystallization, introduction of a substituent for improving the adhesion, and formation of a polymer.

Similarly to the above-described addition-polymerizable compound and sensitizing dye, the use method of the titanocene compound can be appropriately and freely selected according to the designed performance of the photosensitive material. For example, by using two or more kinds of titanocene compounds, the compatibility in the photosensitive composition layer can be improved. In view of photosensitivity, use of the titanocene compound in a larger amount is usually more advantageous. Sufficiently high sensitivity can be obtained by using the titanocene compound in an amount of 0.5 to 80 parts by weight, and preferably from 1 to 50 parts by weight, per 100 parts by weight of the photosensitive layer components. On the other hand, for using under a white lamp such as yellow lamp, the amount of titanocene used is preferably smaller in view of fogging due to light in the vicinity of 500 nm. However, when combined with the sensitizing dye of the present invention, sufficiently high photosensitivity can be obtained even if the amount of titanocene used is reduced to 6 parts by weight or less, further to 1.9 parts by weight or less, even to 1.4 parts by weight or less.

(B) Compound of Undergoing a Reaction with at Least one of a Radical and an Acid to Change at Least one of its Physical and Chemical Properties and Maintaining the Changed Physical or Chemical Property The third essential component (iii) of the present invention is a compound in which the physical or chemical property is changed by the action of an active species generated upon photo-reaction of the above-described photo-initiation system and maintained. Any compound can be freely used without any particular limitation insofar as the compound has such properties. For example, the compounds described above for the initiation system each itself has such properties in many cases. The characteristics of the component (iii), which are changed by the action of a radical, an acid and/or a base generated from the photo-initiation system, include molecular physical properties such as absorption spectrum (color), chemical structure and polarizability, and physical properties of the material such as solubility, strength, refractive index, fluidity and adhesive property.

For example, when a compound of changing the absorption spectrum by pH, such as pH indicator, is used as the component (iii) and an acid or a base is generated from the initiation system, the color tone can be changed only in the exposed area. Such a composition is useful as an image forming material. Similarly, when a compound of changing in the absorption spectrum by oxidation-reduction or nucleophilic addition reaction is used as the component (iii), oxidation, reduction or the like is induced by a radical generated from the initiation system and thereby image formation can be effected. These are disclosed, for example, in *J. Am. Chem. Soc.*, 108, 128 (1986), *J. Imaging Sci.*, 30, 215 (1986) and *Israel. J. Chem.*, 25, 264 (1986).

Also, a photocurable resin or a negative working photopolymer can be formed by combining an addition-polymerizable or condensation-polymerizable compound as the component (iii) and the initiation system.

As the component (iii), a radical polymerizable compound (eg., compound having an ethylenically unsaturated bond), a cationic polymerizable compound (e.g., epoxy compound, vinyl ether compound, methylol compound) or an anionic polymerizable compound (e.g., epoxy compound) is used. These are described, for example, in *Photopolymer Handbook*, edited by Photopolymer Konwa Kai, published by Kogyo Chosa Kai (1989), and *Kobunshi (Polymer)*, 45, 786 (1996). A composition in which a thiol compound is used as the component (iii) and combined with a photo-radical generation system is also well known.

It is also effective to use an acid-decomposable compound as the component (iii) and combine it with a photoacid generator. For example, a material which uses a polymer having a side chain or main chain decomposable by an acid and changes in the solubility or hydrophilic/hydrophobic property by light is broadly used in practice as a photodecomposable photosensitive resin or a positive working photopolymer, Specific examples thereof include those described, for example, in *ACS. Symp. Ser.*, 242, 11 (1984), JP-A-60-3625, U.S. Pat. Nos. 5,102,771, 5,206,317 and 5,212,047, JP-A-4-26850, JP-A-3-1921731, JP-A-60-10247 and JP-A-62-40450.

The addition-polymerizable compound as a component (iii) particularly useful for obtaining a high-sensitive lithographic printing plate precursor which is one of the objects of the present invention is described in detail below.

(B-1) Addition-polymerizable Compound

The addition-polymerizable compound having at least one ethylenically unsaturated double bond, as a preferred component (iii) for use in the present invention, is selected from compounds having at least one, preferably two or more, terminal ethylenically unsaturated double bonds. Such compounds are widely known in the field of art and can be used in the present invention without any particular limitation. These compounds have a chemical form such as monomer, prepolymer, namely dimer, trimer or oligomer or a mixture thereof, or copolymer thereof. Examples of the monomer and the copolymer thereof include unsaturated carboxylic acids (e.g., acrylic acid, methacrylic acid, itaconic acid, crotonic acid, isocrotonic acid, maleic acid) and esters or amides thereof. Among these, preferred are esters of an unsaturated carboxylic acid with an aliphatic polyhydric alcohol compound, and amides of an unsaturated carboxylic acid with an aliphatic polyvalent amine compound. An addition reaction product of an unsaturated carboxylic acid ester or amide having a nucleophilic substituent such as hydroxyl group, amino group or mercapto group with a monofunctional or polyfunctional isocyanate or epoxy, or a dehydration condensation reaction product of the unsaturated carboxylic acid ester or amide with a monofunctional or polyfunctional carboxylic acid is also suitably used.

Furthermore, an addition reaction product of an unsaturated carboxylic acid ester or amide having an electrophilic substituent such as isocyanato group or epoxy group with a monofunctional or polyfunctional alcohol, amine or thiol, or a substitution reaction product of an unsaturated carboxylic acid ester or amide having a releasable substituent such as halogen group or tosyloxy group with a monofunctional or polyfunctional alcohol, amine or thiol is also suitably used. Additionally, compounds in which the unsaturated carboxylic acid is replaced by an unsaturated phosphonic acid, styrene, vinyl ether or the like can also be used.

Specific examples of the monomer, which is an ester of an aliphatic polyhydric alcohol compound with an unsaturated carboxylic acid, include acrylic acid esters such as ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate and polyester acrylate oligomer; methacrylic acid esters such as tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)-phenyl]dimethylmethane and bis[p-(methacryloxyethoxy)-phenyl]dimethylmethane; itaconic acid esters such as ethylene glycol diitaconate, propylene glycol diitaconate, 1,3-butanediol diitaconate, 1,4-butanediol diitaconate, tetramethylene glycol diitaconate, pentaerythritol diitaconate and sorbitol tetraitaconate; crotonic acid esters such as ethylene glycol dicrotonate, tetramethylene glycol dicrotonate, pentaerythritol dicrotonate and sorbitol tetradicrotonate; isocrotonic acid esters such as ethylene glycol diisocrotonate, pentaerythritol diisocrotonate and sorbitol tetraisocrotonate; and maleic acid esters such as ethylene glycol dimaleate, triethylene glycol dimaleate, pentaerythritol dimaleate and sorbitol tetramaleate.

Other examples of the ester, which can be suitably used, include aliphatic alcohol-base esters described in JP-B-46-27926, JP-B-51-47334 and JP-A-57-196231, those having an aromatic skeleton described in JP-A-59-5240, JP-A-59-5241 and JP-A-2-226149, and those containing an amino group described in JP-A-1-165613.

The above-described ester monomers can also be used as a mixture.

Specific examples of the monomer, which forms an amide of an aliphatic polyvalent amine compound with an unsaturated carboxylic acid, include methylene bis-acrylamide, methylene bis-methacrylamide, 1,6-hexamethylene bis-acrylamide, 1,6-hexamethylene bis-methacrylamide, diethylenetriamine tris-acrylamide, xylylene bis-acrylamide and xylylene bis-methacrylamide.

Other preferred examples of the amide-base monomer include those having a cyclohexylene structure described in JP-B-54-21726.

A urethane-base addition polymerizable compound produced using an addition reaction between an isocyanate and a hydroxyl group is also suitably used and specific examples thereof include vinylurethane compounds having two or more polymerizable vinyl groups within one molecule obtained by adding a vinyl monomer containing a hydroxyl group represented by the following formula (6) to a polyisocyanate compound having two or more isocyanate groups within one molecule, described in JP-B-48-41708.

$$CH_2=C(R)COOCH_2CH(R')OH \qquad (6)$$

wherein R and R' each represents H or $CH_3$.

Also, urethane acrylates described in JP-A-51-37193, JP-B-2-32293 and JP-B-2-16765, and urethane compounds having an ethylene oxide-base skeleton described in JP-B-58-49860, JP-B-56-17654, JP-B-62-39417 and JP-B-62-39418 may be suitably used.

Furthermore, a photosensitive composition having remarkably excellent sensitizing speed can be obtained by using an addition-polymerizable compound having an amino structure or a sulfide structure within the molecule, described in JP-A-63-277653, JP-A-63-260909 and JP-A-1-105238.

Other examples include polyfunctional acrylates and methacrylates such as polyester acrylates and epoxy acrylates obtained by reacting an epoxy resin with a (meth)acrylic acid, described in JP-A-48-64183, JP-B-49-43191 and JP-B-52-30490, Specific unsaturated compounds described in JP-B-46-43946, JP-B-1-40337 and JP-B-1-40336, and vinylphosphonic acid-base compounds described in JP-A-2-25493 can also be used. In some cases, the structure containing a perfluoroalkyl group described in JP-A-61-22048 can be suitably used. Also, those described as a photocurable monomer or oligomer in *Nippon Secchaku Kyokai Shi* (*Journal of Japan Adhesion Society*), Vol. 20, No, 7, pp. 300–308 (1984) can be used.

Details of the use method of the addition-polymerizable compound, such as selection of the structure, sole or combination use and amount added, can be freely selected in accordance with the designed performance of final sensitive material. For example, the compound is selected from the following standpoints. In view of sensitizing speed, a structure having a large unsaturated group content per one molecule is preferred and in most cases, a bifunctional or greater functional group is preferred. For increasing the strength of image portion, namely, hardened layer, a trifunctional or greater functional group is preferred. A combination use of compounds different in the functional number and in the polymerizable group (for example, an acrylic acid ester, a methacrylic acid ester, a styrene-base compound or a vinyl ether-base compound) is an effective method for controlling both the photosensitivity and the strength. A compound having a large molecular weight or a compound having high hydrophobicity is excellent in the sensitizing speed and layer strength but is not preferred in some cases in view of developing speed and precipitation in the developer.

The selection and use method of the addition polymerization compound are important factors for the compatibility and dispersibility with other components (e.g., binder polymer, initiator, coloring agent) in the photosensitive composition. For example, the compatibility may be improved in some cases by using a low purity compound or using two or more compounds in combination. In the case of manufacturing a lithographic printing plate precursor, a specific structure may be selected for the purpose of improving the adhesive property to a support or overcoat layer described hereinafter. As for the blending ratio of the addition-polymerizable compound in the photosensitive composition, a larger ratio is advantageous in view of sensitivity but if the blending ratio is too large, undesired phase separation may occur, a problem may arise in the production step due to adhesive property of the photosensitive composition (e.g., production failure due to transfer or adhesion of the photosensitive components), and when a lithographic printing plate precursor is manufactured, precipitation in the developer may be disadvantageously generated. In view of these points, the blending ratio is in most cases preferably from 5 to 80 wt %, more preferably from 25 to 75 wt %, based on all components of the composition. The addition-polymerizable compounds may be used individually or in combination of two or more thereof, As for the use method of the addition-polymerizable compound, appropriate structure, blending and amount added can be freely selected by taking account of the degree of polymerization inhibition due to oxygen, resolution, fogging, change in refractive index, surface adhesive property and the like. Depending on the case, a layer construction and a coating method, such as undercoat and overcoat, can also be employed.

(C) Binder Polymer

In the application to a lithographic printing plate precursor as a preferred embodiment of the present invention, a binder polymer is preferably further used in the photosensitive layer. The binder is preferably a linear organic high molecular polymer. The "linear organic high molecular polymer" may be any linear organic high molecular polymer. Preferably, a linear organic high molecular polymer soluble or swellable in water or alkalescent water, which enables water development or alkalescent water development, is selected. The linear organic high molecular polymer is selected not only as a film forming agent of the composition but also considering the use of water, alkalescent water or organic solvent as developer. For example, when a water-soluble organic high molecular polymer is used, water development can be performed. Examples of the linear organic high molecular polymer include addition polymers having a carboxylic acid group on the side chain, for example, methacrylic acid copolymers, acrylic acid copolymers, itaconic acid copolymers, crotonic acid copolymers, maleic acid copolymers and partially esterified maleic acid copolymers described in JP-A-59-44615, JP-B-54-34327, JP-B-58-12577, JP-B-54-25957, JP-A-54-92723, JP-A-59-53836 and JP-A-59-71048. Furthermore, acidic cellulose derivatives having a carboxylic acid group on the side chain may also be used. In addition, polymers obtained by adding a cyclic acid anhydride to the above-described addition polymers having a hydroxyl group are also useful.

Among these, [benzyl (meth)acrylate/(meth)acrylic acid/ another addition polymerizable vinyl monomer, if desired] copolymers and [allyl (meth)acrylate/(meth)acrylic acid/ another addition polymerizable vinyl monomer, if desired] copolymers are preferred because of their excellent balance in the film strength, sensitivity and developability.

Also, the acid group-containing urethane-base binder polymers described in JP-B-7-120040, JP-B-7-120041, JP-B-7-120042, JP-B-8-12424, JP-A-63-287944, JP-A-63-287947, JP-A-1-271741 and Japanese Patent Application No. 10-116232 are advantageous in view of press life and low exposure suitability because of their very excellent strength.

When the acid group-containing urethane-base binder is used in the photosensitive composition of the present invention, the sensitivity thereof is preferably increased. Although the reason for increasing the sensitivity is not completely clear, it is presumed that the nitrogen atom in the heterocyclic ring included in the skeleton of the sensitizing dye interacts with the urethane bond in the urethane-base binder to increase in compatibility in the photosensitive layer, whereby the sensitivity increases.

The binder having an amido group described in JP-A-11-171909 has both excellent developability and film strength and therefore, is suitably used.

Other than these, polyvinyl pyrrolidone, polyethylene oxide and the like are useful as a water-soluble linear organic polymer. Also, an alcohol-soluble nylon and a polyether of 2,2-bis-(4-hydroxyphenyl)-propane with epichlorohydrin are useful for the purpose of increasing the strength of hardened film. The linear organic high molecular polymer can be mixed in an arbitrary amount based on the entire composition. However, if the amount exceeds 90 wt %, an undesired effect may result in view of image strength or the like. The amount added is preferably from 30 to 85 wt %. Also, the photopolymerizable compound having an ethylenically unsaturated double bond and the linear organic high molecular polymer are preferably used at a weight ratio of 1/9 to 7/3.

In a preferred embodiment, the binder polymer is substantially insoluble in water and soluble in alkali. By using such a binder, use of an organic solvent which is preferably not used in the developer from the environmental concern can be avoided or limited to a very small amount. In such a case, the acid value (acid content per 1 g of polymer, expressed by the chemical equivalent number) and molecular weight of the binder polymer are appropriately selected by taking account of the image strength and the developability. The acid value is preferably from 0.4 to 3.0 meq/g, more preferably from 0.6 to 2.0 meq/g, and the molecular weight is preferably from 3,000 to 500,000, more preferably from 10,000 to 300,000.

(D) Other Components

The photosensitive composition of the present invention may further appropriately contain other components suitable for use, production method and the like. Preferred additives are described below.

(D1) Co-sensitizer

The sensitivity can be further elevated by using a certain additive (hereinafter referred to as a "co-sensitizer"). The operation mechanism is not clearly known but considered to be mostly based on the following chemical process. That is, the co-sensitizer reacts with various intermediate active species (e.g., radical, peroxide, oxidizing agent and reducing agent) generated during the process of photo-reaction initiated upon light absorption of the above-described initiation system and subsequent addition-polymerization reaction, to produce new active radicals. Such compounds are roughly classified into (a) compound which is reduced to produce an active radical, (b) compound which is oxidized to produce an active radical and (c) compound which react with a radical having low activity to convert it into a more highly active radical or act as a chain transfer agent. However, in many cases, a common view is not present about which compound belongs to which type.

(a) Compound which is Reduced to Produce an Active Radical Compound Having Carbon-halogen Bond:

An active radical is considered to be generated by the reductive cleavage of carbon-halogen bond. Specific examples of the compound which can be suitably used include trihalomethyl-s-triazines and trihalomethyloxadiazoles. Compound having nitrogen-nitrogen bond:

An active radical is considered to be generated by the reductive cleavage of nitrogen-nitrogen bond. Specific examples of the compound which can be suitably used include hexaarylbiimidazoles.

Compound Having Oxygen-oxygen Bond:

An active radical is considered to be generated by the reductive cleavage of oxygen-oxygen bond. Specific examples of the compound which can be suitably used include organic peroxides.

Onium Compound:

An active radical is considered to be generated by the reductive cleavage of carbon-hetero bond or oxygen-nitrogen bond. Specific examples of the compound which can be suitably used include diaryliodonium salts, triarylsulfonium salts and N-alkoxypyridinium (azinium) salts.

Ferrocene and Iron Allene Complexes:

An active radical can be reductively produced.

(b) Compound which is Oxidized to Produce an Active Radical Alkylate Complex:

An active radical is considered to be generated by the oxidative cleavage of carbon-hetero bond. Specific examples of the compound which can be suitably used include triaryl alkylborates.

Alkylamine Compound:

An active radical is considered to be generated by the oxidative cleavage of C—X bond on the carbon adjacent to nitrogen, where X is preferably a hydrogen atom, a carboxyl group, a trimethylsilyl group or a benzyl group. Specific examples of the compound include ethanolamines, N-phenylglycines and N-trimethylsilylmethylanilines.

Sulfur- or tin-containing compound:

This is a compound in which the nitrogen atom of the above-described amines is replaced by a sulfur atom or a tin atom. An active radical is produced by the same action. Also, a compound having an S—S bond is known to effect sensitization by the cleavage of S—S. α-Substituted methylcarbonyl compound:

An active radical is produced by the oxidative cleavage of carbonyl-α carbon bond. The compound in which the carbonyl is converted into an oxime ether also shows the similar function. Specific examples of the compound include 2-alkyl-1-[4-(alkylthio)phenyl]-2-morpholinopronone-1 and oxime ethers thereof obtained by the reaction with a hydroxyamine and subsequent etherification of N—OH.

Sulfonic Acid Salts:

An active radical is reductively produced. Specific examples of the compound include sodium arylsulfinate.

(c) Compound Which Reacts with a Radical to Convert it into a More Highly Active Radical or Acts as a Chain Transfer Agent:

For example, compounds having SH, PH, SiH or GeH within the molecule are used. These compounds donate hydrogen to a low activity radical species to produce a radical or are oxidized and deprotonized to produce a radical. Specific examples of the compound include 2-mercaptobenzimidazoles.

A large number of examples of the co-sensitizers are more specifically described, for example, in JP-A-9-236913 as an additive for improving sensitivity. Some of these are set forth below, however, the present invention is not limited thereto.

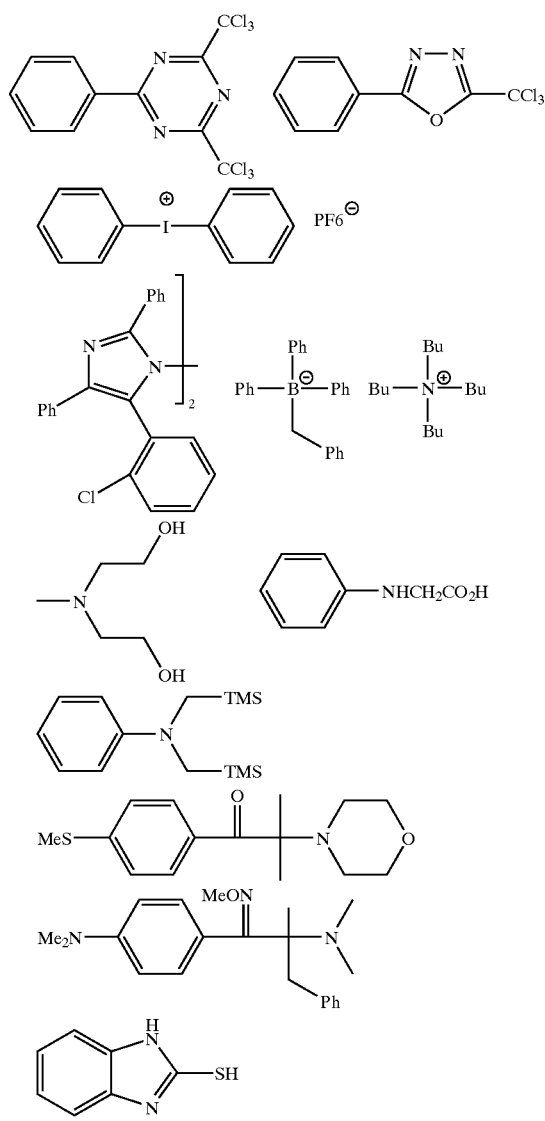

Similarly to the above-described sensitizing dye, the co-sensitizer can be subjected to various chemical modifications so as to improve the characteristics of the photosensitive layer. For example, methods such as binding to the sensitizing dye, activator, addition-polymerizable unsaturated compound or other parts, introduction of a hydrophilic site, introduction of a substituent for improving compatibility, inhibiting crystallization or improving adhesion, and formation of a polymer, may be used.

Of the co-sensitizers, the compound which is oxidized to produce an active radical is preferably employed in the photosensitive composition of the present invention in view of increase in sensitivity. The α-substituted methylcarbonyl compound is more preferably used and the oxime ether compound is still more preferably used. Although the reason for increasing the sensitivity by using the compound which is oxidized to produce an active radical together with the sensitizing dye having the specific structure according to the present invention, it is presumed that an efficiency of generating a novel active species during the process of addition-polymerization reaction subsequent to the light absorption increases.

These co-sensitizers can be used individually or in combination of two or more thereof. The amount of the co-sensitizer used is from 0.05 to 100 parts by weight, preferably from 1 to 80 parts by weight, more preferably from 3 to 50 parts by weight, per 100 parts by weight of the compound having an ethylenically unsaturated double bond.

(D2) Polymerization Inhibitor

In the present invention, a small amount of a thermal polymerization inhibitor is preferably added in addition to the above-described basic components, so as to prevent the polymerizable compound having an ethylenically unsaturated double bond from undergoing undesirable thermal polymerization during the production or storage of the photosensitive composition. Examples of suitable thermal polymerization inhibitors include hydroquinone, p-methoxyphenol, di-tert-butyl-p-cresol, pyrogallol, tert-butylcatechol, benzoquinone, 4,4'-thiobis(3-methyl-6-tert-butylphenol), 2,2'-methylenebis(4-methyl-6-tert-butylphenol) and N-nitrosophenylhydroxyamine cerium(III) salt. The amount of the thermal polymerization inhibitor added is preferably from about 0.01 to about 5 wt %, based on the weight of the entire composition. If desired, in order to prevent polymerization inhibition by oxygen, a higher fatty acid derivative such as behenic acid or behenic acid amide may be added and when a lithographic printing plate precursor is manufactured, allowed to localize on the photosensitive layer surface during the drying step after the coating on a support or the like. The amount of the higher fatty acid derivative added is preferably from about 0.5 to about 10 wt % based on the entire composition.

(D3) Coloring Agent and the Like

In the case of using the photosensitive composition of the present invention for a lithographic printing plate precursor, a dye or a pigment may be added for the purpose of coloring the photosensitive layer. By such a coloring, so-called plate inspection such as visibility of the printing plate after the plate-making or suitability for an image density meter can be improved. Since many dyes cause reduction in the sensitivity of photosensitive layer, a pigment is preferably used as the coloring agent. Specific examples include pigments such as phthalocyanine-base pigment, azo-base pigment, carbon black and titanium oxide, and dyes such as Ethyl Violet, Crystal Violet, azo-base dye, anthraquinone-base dye and cyanine-base dye. The amount of the dye or pigment added is preferably from about 0.5 to about 5 wt % based on the entire composition.

(D4) Other Additives

In the case of using the photosensitive composition of the present invention for a lithographic printing plate precursor, other known additives may be further added, such as inorganic filler and plasticizer for improving physical properties of the hardened film, and oil-sensitizer capable of improving the inking property on the photosensitive layer surface.

Examples of the plasticizer include dioctyl phthalate, didodecyl phthalate, triethylene glycol dicaprylate, dimethyl glycol phthalate, tricresyl phosphate, dioctyl adipate, dibutyl sebacate and triacetylglycerol. In the case of using a binder, the plasticizer can be added in an amount of 10 wt % or less based on the total weight of the compound having an ethylenically unsaturated double bond and the binder.

Also, a UV initiator, a heat crosslinking agent and the like may be added for elevating the effect of heating and exposure after the development and thereby improving the film strength (press life) which will be described later.

In addition, for improving the adhesion between the photosensitive layer and a support or elevating the developing and removing property of unexposed photo-sensitive layer, an additive may be added or an interlayer may be provided. For example, a compound showing a relatively strong interaction with the substrate, such as compound having a diazonium structure or phosphone compound may be added or undercoated, whereby the adhesive property and the press life can be enhanced. Also, by the addition or undercoating of a hydrophilic polymer such as polyacrylic acid or polysulfonic acid, the developability of non-image area is improved and resistance to stain can be improved.

In the case of coating the photopolymerizable composition of the present invention on a support to provide a lithographic printing plate, the composition is used after dissolving it in various organic solvents. Examples of the solvent used here include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxymethoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethyl sulfoxide, γ-butyrolactone, methyl lactate and ethyl lactate. The solvents may be used individually or as a mixture. The concentration of solid content in the coating solution is suitably from 2 to 50 wt %.

The coverage of the photosensitive layer on the support affects mainly the sensitivity and developability of photosensitive layer and the strength and press life of exposed layer and therefore, an appropriate coverage is preferably selected according to the use end. If the coverage is too small, press life is not sufficient, whereas if it is excessively large, the sensitivity decreases, as a result, not only the exposure but also the development processing disadvantageously take a longer time. In the case of a lithographic printing plate for scanning exposure, which is a main object of the present invention, the coverage is suitably, in terms of the weight after drying, from about 0.1 to about 10 g/m$^2$, more preferably from 0.5 to 5 g/m$^2$.

Support

In order to obtain a lithographic printing plate as a main object of the present invention, the above-described photosensitive layer is preferably provided on a support having a hydrophilic surface. As for the hydrophilic support, conventionally known hydrophilic supports used for lithographic printing plates can be used without any limitation. The support used is preferably a dimensionally stable plate-like material, such as paper, paper laminated with plastic (e.g., polyethylene, polypropylene, polystyrene), metal plate (e.g., aluminum, zinc, copper), plastic film (e.g., cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, polyvinyl acetal) and paper or plastic film having laminated or vapor-deposited thereon the above-described metal. If desired, the surface of the support may be subjected to an appropriate known physical or chemical treatment for the purpose of imparting hydrophilicity, improving the strength or the like.

Among these supports, preferred are paper, polyester film and aluminum plate. In particular, aluminum plate is preferred, because it has good dimensional stability, is relatively inexpensive and can provide a surface having excellent hydrophilicity and strength, if desired, by a surface treatment. Also, the composite sheet comprising an aluminum sheet having bonded thereon a polyethylene terephthalate film described in JP-B-48-18327 is preferred.

The aluminum plate is preferably a pure aluminum plate or an alloy plate mainly comprising aluminum and containing trace hetero-elements. A plastic film laminated or vapor-deposited with aluminum may also be used. Examples of the hetero-element contained in the aluminum alloy include silicon, iron, manganese, copper, magnesium, chromium, zinc, bismuth, nickel and titanium. The hetero-element content in the alloy is at most 10 wt %. The aluminum particularly preferred in the present invention is pure aluminum, however, since perfect pure aluminum is difficult to produce in view of the refining technique, the aluminum may contain trace hetero-elements. The composition of the aluminum plate for use in the present invention is not specified and conventionally known aluminum plates in common use can be appropriately used. The thickness of the aluminum plate for use in the present invention is approximately from 0.1 to 0.6 mm, preferably from 0.15 to 0.4 mm, more preferably from 0.2 to 0.3 mm.

In the case of a support having a metal surface, particularly an aluminum surface, the support is preferably subjected to a surface treatment such as surface roughening (graining), dipping in an aqueous solution of sodium silicate, potassium fluorozirconate or phosphate, or anodization.

The surface roughening treatment of the aluminum plate may be performed by various methods such as a method of mechanically roughening the surface, a method of electrochemically dissolving and roughening the surface or a method of selectively dissolving the surface by chemical means. Examples of the mechanical method which can be used include known methods such as ball graining, brush graining, blast graining and buff graining. Examples of the electrochemical surface roughing method include a method of performing the surface roughening in an electrolytic solution such as hydrochloric acid or nitric acid by passing an alternating current or a direct current. A combination of these two kinds of methods disclosed in JP-A-54-63902 may also be used. If desired, in order to remove rolling oil on the surface, a degreasing treatment with a surfactant, an organic solvent, an alkaline aqueous solution or the like is performed in advance of the surface roughening of the aluminum plate.

An aluminum plate which is roughened and then dipped in an aqueous sodium silicate solution may also be preferably used. An aluminum plate subjected to an anodization treatment and then to a dipping treatment in an aqueous alkali metal silicate solution described in JP-B-47-5125 is suitably used. The anodization treatment is performed by passing a current using the aluminum plate as anode in an aqueous or non-aqueous electrolytic solution of an inorganic acid such as phosphoric acid, chromic acid, sulfuric acid or boric acid, an organic acid such as oxalic acid or sulfamic acid, or a salt thereof. These aqueous or non-aqueous electrolytic solutions may be used individually or in combination of two or more thereof.

The silicate electrodeposition method described in U.S. Pat. No. 3,658,662 is also effective.

Furthermore, a surface treatment in which a support subjected to electrolytic graining is combined with the above-described anodization treatment and sodium silicate treatment, disclosed in JP-B-46-27481, JP-A-52-58602 and JP-A-52-30503 is also useful.

Also, a support subjected to mechanical roughening, chemical etching, electrolytic graining, anodization and sodium silicate treatment in this order, disclosed in JP-A-56-28893, is suitably used.

A support which is subjected to, after these treatments, undercoating with a water-soluble resin such as polyvinylphosphonic acid, polymer or copolymer having a sulfonic acid group on the side chain, polyacrylic acid, water-soluble metal salt (e.g., zinc borate), yellow dye, amine salt or the like, is also suitably used.

In addition, a substrate subjected to a sol-gel treatment, where a functional group capable of undergoing an addition reaction by a radical is covalently bonded, disclosed in JP-A-7-159983 may also be suitably used.

Other preferred examples include those obtained by providing a water-resistant hydrophilic layer as a surface layer on an optional support. Examples of the surface layer include a layer comprising an inorganic pigment and a binder described in U.S. Pat. No. 3,055,295 and JP-A-56-13168, a hydrophilic swelling layer described in JP-A-9-80744 and a sol-gel film comprising titanium oxide, polyvinyl alcohol and silicic acids described in JP-W-8-507727 (the term "JP-W" as used herein means an "unexamined published Japanese international patent application").

The hydrophilization treatment is performed not only to render the support surface hydrophilic but also to prevent a harmful reaction of the photopolymerizable composition provided thereon and at the same time, to improve adhesive property of the photosensitive layer.

Protective Layer

In the case of a lithographic printing plate for scanning exposure as a preferred embodiment of the present invention, the exposure is generally performed in air and therefore, a protective layer is preferably provided further on the photopolymerizable composition layer. The protective layer prevents oxygen or low molecular weight compounds such as basic substance present in air, which inhibit the image forming reaction generated upon exposure in the photosensitive layer, from permeating into the photosensitive layer and enables exposure in air. Accordingly, the protective layer is demanded to have the following properties, that is, to have low permeability to oxygen or low molecular weight compounds, not to substantially inhibit the transmission of light used for exposure, to exhibit good adhesion to the photosensitive layer and to be easily removable in the development step after exposure.

Various investigations on the protective layer have been made and are described in detail, for example, in U.S. Pat. No. 3,458,311 and JP-A-55-49729. The material which can be used for the protective layer is suitably, for example, a water-soluble polymer compound having relatively excellent crystallinity. Specifically, water-soluble polymers such as polyvinyl alcohol, polyvinyl pyrrolidone, acidic celluloses, gelatin, gum arabic and polyacrylic acid are known. Among these, when polyvinyl alcohol is used as the main component, most excellent results can be obtained in view of fundamental properties such as oxygen blocking property and removability by development. The polyvinyl alcohol used for the protective layer may be partially substituted with an ester, an ether or an acetal insofar as it contains an unsubstituted vinyl alcohol unit for giving necessary oxygen blocking property and water solubility. Similarly, a part may have another copolymer component.

Examples of the polyvinyl alcohol include those having a hydrolysis degree of 71 to 100% and a molecular weight of 300 to 2,400. Specific examples thereof include PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613 and L-8 produced by Kuraray Co., Ltd.

The components (selection of PVA, use of additives) and coating amount of the protective layer are determined by taking account of the oxygen blocking property, development removability, fogging, adhesive property and scratch resistance. In general, as the hydrolysis degree of PVR is higher (as the unsubstituted vinyl alcohol unit content in the protective layer is higher) and as the layer thickness is larger, the oxygen blocking property becomes higher, which is advantageous in view of sensitivity. However, if the oxygen blocking property is excessively elevated, there arise problems, for example, an unnecessary polymerization reaction takes place during the production or stock storage, or undesirable fogging or thickening of image lines is cause d at the time of image exposure. The adhesion to the image area and scratch resistance are also important factors in view of handling of the plate. More specifically, when a hydrophilic layer comprising a water-soluble polymer is laminated on a lipophilic polymerization layer, delamination is liable to occur due to insufficient adhesive strength and the delaminated part causes a defect Such as hardening failure due to polymerization inhibition by oxygen.

To overcome such a problem, various proposals have been made with an attempt to improve the adhesive property between these two layers. For example, U.S. Pat. Nos. 292,501 and 44,563 describe a technique of mixing from 20 to 60 wt % of an acrylic emulsion or a water-insoluble vinyl pyrrolidone-vinyl acetate copolymer in a hydrophilic polymer mainly comprising a polyvinyl alcohol and laminating the mixture on the polymerization layer, thereby obtaining sufficient adhesive property. These known techniques all can be applied to the protective layer of the present invention. The coating method of such a protective layer is described in detail, for example, in U.S. Pat. No. 3,458,311 and JP-A-55-49729.

Furthermore, other functions may also be imparted to the protective layer. For example, when a coloring agent (e.g., water-soluble dye) having excellent transmittance of light at 350 to 450 nm used for the exposure and capable of efficiently absorbing light of 500 nm or more is added, the safe light aptitude can be more improved without causing reduction in the sensitivity.

In the case where a photosensitive material using the photosensitive composition of the present invention is used as an image-forming material, an image is usually obtained by performing image exposure and then removing unexposed area of the photosensitive layer with a developer.

Examples of the developer preferably employed for the manufacture of a lithographic printing plate using the photosensitive composition include a developer described in JP-B-57-7427. The developer is suitably an aqueous solution of an inorganic alkali agent such as sodium silicate, potassium silicate, sodium hydroxide, potassium hydroxide, lithium hydroxide, sodium tertiary phosphate, sodium secondary phosphate, ammonium tertiary phosphate, ammonium secondary phosphate, sodium metasilicate, sodium bicarbonate and aqueous ammonia, or an aqueous solution of an organic alkali agent such as monoethanolamine and diethanolamine. The concentration of the alkali solution is from 0.1 to 10 wt %, preferably from 0.5 to 5 wt %.

If desired, the alkaline aqueous solution may contain a small amount of a surface active agent or an organic solvent such as benzyl alcohol, 2-phenoxyethanol and 2-butoxyethanol. Examples thereof include those described in U.S. Pat. Nos. 3,375,171 and 3,615,480.

The developers described in JP-A-50-26601, JP-A-58-54341, JP-B-56-39464 and JP-B-56-42860 are also excellent.

In another plate-making process of a lithographic printing plate precursor using the photosensitive composition of the present invention, the entire surface may be heated, if desired, before or during exposure or between exposure and development. By the heating, the image forming reaction in the photosensitive layer is accelerated and effects such as improvement in the sensitivity and press life and stabilization of the sensitivity are achieved. For the purpose of improving the image strength and press life, it is also effective to perform entire after-heating or entire exposure of the image after development. In general, the heating before development is preferably performed under a mild condition of 150° C. or less. If the temperature is too high, there arise problems such as fogging of the non-image area. The heating after development uses a very strong condition, usually from 200 to 500° C. If the temperature is too low, a sufficiently high effect of strengthening the image may not be obtained, whereas if it is excessively high, there arise problems such as deterioration of the support and thermal decomposition of the image area.

As for the exposure method of a lithographic printing plate for scanning exposure using the photosensitive composition of the present invention, known methods can be used without limitation. The light source preferably has a wavelength of 350 to 450 nm and, specifically, an InGaN semiconductor laser is suitably used. The exposure mechanism may be any of internal drum system, external drum system and flat bed system. When the photosensitive composition of the present invention used has high water solubility, the photosensitive layer can be made soluble in neutral water or alkalescent water and a lithographic printing plate precursor having such a construction can be loaded on a printing machine and then subjected to exposure and development on the machine.

As for the available laser light source of 350 to 450 nm, the followings can be used.

A gas laser such as Ar ion laser (364 nm, 351 nm, 10 mW to 1 W), Kr ion laser (356 nm, 351 nm, 10 mW to 1 W) and He—Cd laser (441 nm, 325 nm, 1 mW to 100 mW) may be used.

A solid laser such as a combination of Nd:YAG ($YVO_4$) with SHG crystalsxtwice (355 nm, 5 mW to 1 W) and a combination of Cr:LiSAF with SHG crystal (430 nm, 10 mW) may be used.

A semiconductor laser system such as a $KNBOb_3$ ring resonator (430 nm, 30 mW), a combination of a waveguide-type wavelength conversion element with an AlGaAs or InGaAs semiconductor (380 nm to 450 nm, 5 mW–100 mW), a combination of a waveguide-type wavelength conversion element with an AlGaInP or AlGaAs semiconductor (300 nm to 350 nm, 5 mW to 100 mW), and AlGaInN (350 nm to 450 nm, 5 mW to 30 mW) may be used.

A pulse laser such as $N_2$ laser (337 nm, pulse 0.1 to 10 mJ) and XeF (351 mn, pulse 10–250 mJ) may be used.

Among these light sources, the AlGaInN semiconductor laser (commercially available InGaN semiconductor laser, 400 to 410 nm, 5 to 30 mw) is particularly suitable in view of the wavelength property and cost.

As for the exposure apparatus for a lithographic printing plate of scanning exposure system, the exposure mechanism includes an internal drum system, an external drum system and a flat bed system. The light source is preferably a light source capable of continuous oscillation among the above-described light sources. In practice, the following exposure apparatuses are particularly preferred in view of the relationship between the sensitivity of photosensitive material and the plate-making time.

A single to triple beam exposure apparatus of internal drum system, using one or more gas or solid laser light source to give a semiconductor laser having a total output of 20 mW or more.

A multi-beam (from 1 to 10 beams) exposure apparatus of flat bed system, using one or more semiconductor, gas or solid laser to give a total output of 20 mW or more.

A multi-beam (from 1 to 9 beams) exposure apparatus of external drum system, using a semiconductor, gas or solid laser to give a total output of 20 mW or more.

A multi-beam (10 or more beams) exposure apparatus of external drum system, using a semiconductor or solid laser to give a total output of 20 mW or more.

In the laser direct drawing-type lithographic printing plates, the following equation (eq 1) is ordinarily established among the sensitivity X ($J/cm^2$) of photosensitive material, the exposure area S ($cm^2$) of photosensitive material, the power q (W) of one laser light source, the number n of lasers and the total exposure time t (s):

$$X \cdot S = n \cdot q \cdot t \qquad (eq\ 1)$$

i) In the Case of Internal Drum (Single Beam) System

The following equation (eq 2) is ordinarily established among the laser revolution number f (radian/s), the sub-scanning length Lx (cm) of photosensitive material, the resolution Z (dot/cm) and the total exposure time t (s):

$$f \cdot Z \cdot t = Lx \qquad (eq\ 2)$$

ii) In the Case of External Drum (Multi-beam) System

The following equation (eq 3) is ordinarily established among the drum revolution number F (radian/s), the sub-scanning length Lx (cm) of photosensitive material, the resolution Z (dot/cm), the total exposure time t (s) and the number (n) of beams:

$$F \cdot Z \cdot n \cdot t = Lx \qquad (eq\ 3)$$

iii) In the Case of Flat Bed (Multi-beam) System

The following equation (eq 4) is ordinarily established among the revolution number H (radian/s) polygon mirror, the sub-scanning length Lx (cm) of photosensitive material, the resolution Z (dot/cm), the total exposure time t (s) and the number (n) of beams:

$$F \cdot Z \cdot n \cdot t = Lx \qquad (eq\ 4)$$

When the resolution (2,560 dpi) required for practical printing plate, the plate size (A1/B1, sub-scanning length: 42 inch), the exposure condition of about 20 sheets/1 hour and the photosensitive characteristics (photosensitive wavelength, sensitivity: about 0.1 mJ/cm$^2$) of the photosensitive composition of the present invention are substituted for the above equations, it can be understood that a photosensitive material using the photosensitive composition of the present invention is preferably combined with a multi-beam exposure system using a semiconductor laser to give a total output of 20 mW or more and on taking account of operability, cost and the like, most preferably combined with an external drum system semiconductor laser multi-beam (10 or more beams) exposure apparatus.

Other exposure light beams which can be used for the photosensitive composition of the present invention include an ultra-high pressure mercury lamp, a high pressure mercury lamp, a medium pressure mercury lamp, a low pressure mercury lamp, a chemical lamp, a carbon arc lamp, a xenon lamp, a metal halide lamp, various visible or ultraviolet laser lamps, a fluorescent lamp, a tungsten lamp and sunlight. As for uses, the photosensitive composition of the present invention can be applied not only to the lithographic printing plate for scanning exposure but also to uses over a wide range known as uses of photocurable resin without limitation. For example, when applied to a liquid photopolymerizable composition using, if desired, a cation-polymerizable compound in combination, a high-sensitivity material for rapid prototyping can be obtained A hologram material may also be prepared by making use of change in the refraction index accompanying the photopolymerization. The photosensitive composition of the present invention can also be applied to various transfer materials (e.g., peelable photosensitive material, toner development photosensitive material) by making use of change in the adhesive property on the surface accompanied with the photopolymerization; to photocuring of microcapsules, to the production of electronic materials such as photoresists; and to photocurable resin materials such as ink, paint and adhesive.

The present invention is described in greater detail below by referring to Examples, however, the present invention should not be construed as being limited thereto.

EXAMPLES 1 TO 10 AND COMPARATIVE EXAMPLES 1 TO 6

Preparation of Support

A 0.3 mm-thick aluminum plate was etched by dipping it in an aqueous 10 wt % sodium hydroxide solution at 60° C. for 25 seconds, washed with running water, neutralized and cleaned with an aqueous 20 wt % nitric acid solution and then washed with water. The aluminum plate was then subjected to an electrolytic graining treatment in an aqueous 1 wt % nitric acid solution using an alternating current with a sinusoidal waveform at an anode time electricity of 300 coulomb/dm$^2$. Subsequently, the aluminum plate was dipped in an aqueous 1 wt % sodium hydroxide solution at 40° C. for 5 seconds, dipped in an aqueous 30 wt % sulfuric acid solution at 60° C. for 40 seconds to effect a desmutting treatment, and then subjected to an anodization treatment in an aqueous 20 wt % sulfuric acid solution for 2 minutes at a current density of 2 A/dm$^2$ to form an anodic oxide film having a thickness of 2.7 g/m$^2$. The surface roughness was measured and found to be 0.3 µm (Ra value according to JIS B0601).

On the back surface of the thus-treated plate, the sol-gel reaction solution shown below was coated by a bar coater and dried at 100° C. for 1 minute, thereby preparing a support having provided thereon a backcoat layer having a dry coating amount of 70 mg/m$^2$.

| Sol-gel reaction solution | |
|---|---|
| Tetraethyl silicate | 50 parts by weight |
| Water | 20 parts by weight |
| Methanol | 15 parts by weight |
| Phosphoric acid | 0.05 parts by weight |

The above components were mixed and stirred, and heat generation was started within 5 minutes. After reacting the mixture for 60 minutes, the following solution was added to prepare a coating solution for backcoat layer.

| | |
|---|---|
| Pyrogallol formaldehyde condensed resin (molecular weight: 2,000) | 4 parts by weight |
| Dimethyl phthalate | 5 parts by weight |
| Fluorine-containing surfactant (N-butylperfluorooctane sulfonamidoethyl acrylate/polyoxyethylene acrylate copolymer, molecular weight: 20,000) | 0.7 parts by weight |
| Methanol silica sol (produced by Nissan Chemical Industries, Ltd., methanol: 30 wt %) | 50 parts by weight |
| Methanol | 800 parts by weight |

Preparation of Photosensitive Layer

On the thus-treated aluminum plate, a photosensitive composition having the following composition was coated to have a dry coating amount of 1.0 g/m$^2$ and dried at 80° C. for 2 minutes to form a photosensitive layer.

Photosensitive Composition

| | |
|---|---|
| Pentaerythritol tetraacrylate | 1.5 g |
| Allyl methacrylate/methacrylic acid copolymer (copolymerization molar ratio: 83/17) | 2.0 g |
| Photopolymerization initiation system (shown in Table 2A) | |
| Sensitizing dye | |
| Titanocene compound | |
| Co-sensitizer | |
| Fluorine-containing nonionic surfactant (F-177P) | 0.02 g |
| Thermal polymerization inhibitor (N-nitrosophenylhydroxylamine aluminum salt) | 0.01 g |
| Coloring pigment dispersion | 2.0 g |
| (Composition of pigment dispersion) | |
| Pigment Blue 15:6 | 15 parts by weight |
| Allyl methacrylate/methacrylic acid copolymer (copolymerization molar ratio: 83/17) | 10 parts by weight |
| Cyclohexanone | 15 parts by weight |
| Methoxypropyl acetate | 20 parts by weight |
| Propylene glycol monomethyl ether | 40 parts by weight |
| Methyl ethyl ketone | 20.0 g |
| Propylene glycol monomethyl ether | 20.0 g |

Preparation of Protective Layer

On the photosensitive layer, an aqueous solution containing 3 wt % of polyvinyl alcohol (saponification degree; 98 mol %, polymerization degree: 550) was coated to have a dry coating weight of 2 g/m² and dried at 100° C. for 2 minutes.

Evaluation of Photosensitivity and Storage Stability

A Fuji Step Guide (a gray scale discontinuously changing in the transmission optical density at ΔD=0.15) manufactured by Fuji Photo Film Co., Ltd. was brought into close contact with the thus-obtained photosensitive material and exposure was performed using a xenon lamp through an optical filter. For the purpose of estimating the exposure aptitude for a short wavelength semiconductor laser, KENKO BP-40 capable of exposure with monochromic light of 400 nm was used as the optical filter. Thereafter, development was performed by dipping the photosensitive material in a developer having the following composition at 25° C. for 10 seconds, and the sensitivity (clear sensitivity) was calculated from the highest step number where the image was completely removed (see Table 2A). The clear sensitivity as used herein means a minimum energy necessary for the formation of an image and as the value is lower, the sensitivity is higher.

Separately, the photosensitive material was stored under high temperature condition of 60° C. for 3 days and then exposed in the same manner as above so as to obtain the same clear sensitivity as above, and energy necessary for the formation of image was determined. A ratio of energy (energy necessary for the formation of image after the high temperature storage/energy necessary for the formation of image before the high temperature storage) was calculated It is preferred that the ratio of energy is 1.1 or less in view of storage stability. The results of storage stability obtained are also shown in Table 2A.

TABLE 2A

<(Examples Using Bisbenzothiazole Dye)>

| | Photopolymerization Initiation System (amount added: g) | | | Clear | Storage Stability |
| --- | --- | --- | --- | --- | --- |
| | Sensitizing Dye | Titanocene Compound | Co-Sensitizer | Sensitivity (mJ/cm²) | (ratio of energy) |
| Example 1 | D7 (0.05) | T-1 (0.06) | H1 (0.2) | 0.2 | 1.0 |
| Example 2 | D13 (0.06) | T-2 (0.12) | H5 (0.2) | 0.1 | 1.0 |
| Example 3 | D16 (0.05) | T-2 (0.06) | None | 0.3 | 1.05 |
| Example 4 | D23 (0.05) | T-2 (0.12) | H1 (0.2) | 0.2 | 1.0 |
| Example 5 | D30 (0.08) | T-2 (0.12) | H5 (0.5) | 0.1 | 1.05 |
| Example 6 | D1 (0.05) | T-1 (0.10) | None | 0.5 | 1.05 |
| Example 7 | D7 (0.10) | T-2 (0.06) | H1 (0.2) | 0.3 | 1.0 |
| Example 8 | D23 (0.06) | T-1 (0.06) | None | 0.4 | 1.0 |
| Example 9 | D2 (0.06) | T-2 (0.03) | None | 0.5 | 1.05 |
| Example 10 | D30 (0.05) | T-2 (0.12) | H1 (0.2) | 0.2 | 1.05 |
| Comparative Example 1 | D7 (0.08) | None | None | Image could not be formed | Could not be evaluated |
| Comparative Example 2 | None | T-1 (0.06) | None | 1.8 | 1.5 |
| Comparative Example 3 | None | T-2 (0.12) | H1 (0.2) | 1.0 | 1.7 |
| Comparative Example 4 | D-2 (0.06) | T-2 (0.06) | None | 1.3 | 1.5 |
| Comparative Example 5 | DR-2 (0.12) | T-2 (0.06) | None | 1.0 | 1.6 |
| Comparative Example 6 | DR-1 (0.06) | H-3 (0.12) | None | 1.6 | 1.5 |

As seen from Table 2A, the lithographic printing plate precursor according to the present invention has very high sensitivity and exhibits sufficiently high sensitivity for the scanning exposure system.

The photopolymerization initiation system according to the present invention has high sensitivity as compared with the case of using no sensitizing dye and even in the case where the amount of titanocene added is small, exhibits sufficiently high sensitivity.

Further, the lithographic printing plate precursor of the present invention exhibits excellent storage stability that is sufficient for the production.

Developer

Aqueous solution of pH 13 having the following composition:

| 1K Potassium silicate | 3.0 parts by weight |
| Potassium hydroxide | 1.5 parts by weight |
| Compound of formula (7) | 0.2 parts by weight |
| Water | 95.3 parts by weight |

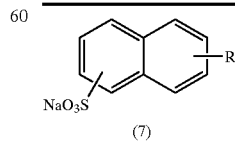

(7)

Pelex NBL, produced by Kao Atlas Co., Ltd.

EXAMPLES 11 TO 19 AND COMPARATIVE EXAMPLE 7

Lithographic printing plates were manufactured as follows and evaluated on the printing performance. The results are shown in Table 3A.

Pretreatment of Support

The surface of a 0.3 mm-thick 1S aluminum plate was grained using No. 8 nylon brush and a water suspension of 800-mesh pumice stone and then thoroughly washed with water. Then, the aluminum plate was etched by dipping it in an aqueous 10 wt % sodium hydroxide solution at 70° C. for 60 seconds, washed with running water, neutralized and cleaned with an aqueous 20 wt % nitric acid solution and then washed with water. The plate was subjected to an electrolytic surface roughening treatment in an aqueous 1 wt % nitric acid solution using an alternating current with a sinusoidal waveform at an anode time electricity of 300 coulomb/dm$^2$ under the condition of $V_A$=12.7 V. The surface roughness was measured and found to be 0.45 μm (Ra value according to JIS 8 0601).

Hydrophilization Treatment of Support Surface

The thus-treated support was dipped in an aqueous solution containing 2.5 wt % of No. 3 sodium silicate (SiO$_2$=28 to 30%, Na$_2$O=9 to 10%, Fe=0.02% or less) at a pH of 11,2 and 70° C. for 13 seconds and then washed with water From the amount of Si element measured by fluorescent X-ray analysis of the surface, the amount of silicate on the surface was determined as 10 mg/m$^2$.

Coating of Interlayer

A coating solution having the following composition (A) was prepared, coated on the surface of the hydrophilized support using a whirler under the condition of 180 rpm such that the amount of phenylphosphonic acid coated became 20 mg/m$^2$, and then dried at 80° C. for 30 seconds.

Interlayer Coating Solution A

| | |
|---|---|
| Phenylphosphonic acid | 0.07 to 1.4 g |
| Methanol | 200 g |

Coating of Photosensitive Layer

A photosensitive solution having the following composition was prepared, coated on the support having provided thereon the interlayer using a whirler to have a coating amount of 1.0 to 2.0 g/m$^2$, and then dried at 100° C. for 1 minute Photosensitive Solution

| | |
|---|---|
| Addition-polymerizable compound (compound shown in Table 3A) | 1.5 g |
| Binder polymer (compound shown in Table 3A) | 2.0 g |
| Sensitizing dye (compound shown in Table 3A) | 0.1 g |
| Activator (compound shown in Table 3A) | 0.1 g |
| Co-sensitizer (compound shown in Table 3A) | 0.3 g |
| Coloring pigment dispersion | 2.0 g |

-continued

| (Composition of pigment dispersion) | |
|---|---|
| Pigment Blue 15:6 | 15 parts by weight |
| Allyl methacrylate/methacrylic acid copolymer (copolymerization molar ratio: 83/17) | 10 parts by weight |
| Cyclohexanone | 15 parts by weight |
| Methoxypropyl acetate | 20 parts by weight |
| Propylene glycol monomethyl ether | 40 parts by weight |
| Thermal polymerization inhibitor (N-nitrosophenylhydroxylamine aluminum salt) | 0.01 g |
| Surfactant (Megafac F-177, produced by Dainippon Ink & Chemicals, Inc.) | 0.02 g |
| Methyl ethyl ketone | 20.0 g |
| Propylene glycol monomethyl ether | 20.0 g |

Coating of Protective Layer

An aqueous solution containing 3 wt % of polyvinyl alcohol (saponification degree: 98 mol %, polymerization degree: 550) was coated on the photosensitive layer to have a dry coating weight of 2 g/m$^2$ and dried at 100° C. for 2 minutes.

Exposure of Lithographic Printing Plate Precursor

The thus-obtained lithographic printing plate precursor was subjected to solid image exposure or dot image exposure at 175 lines/inch increasing from 1 to 99% in 1% steps, using monochromatic light of 400 nm by adjusting the exposure power to give an exposure energy density of 200 μJ/cm$^2$ on the plate surface.

Development/Plate-making

A predetermined developer (shown in Table 3A) and Finisher FP-2W produced by Fuji Photo Film Co., Ltd. were charged into an automatic developing machine LP-850 manufactured by Fuji Photo Film Co., Ltd., and then the exposed plate was subjected to development/plate-making at a developer temperature of 30° C. for a development time of 18 seconds to obtain a lithographic printing plate.

Press Life Test

Printing was conducted using R201 manufactured by Roland Co. as a printing machine and GEOS-G (N) produced by Dainippon Ink & Chemicals, Inc. as ink. The solid image area of the printed matter was observed and the press life was examined by the number of prints when the image started to become thin. As the numeral is larger, the press life is better.

Dot Image Press Life Test Under Forced Condition

Printing was conducted using R201 manufactured by Roland Co. as a printing machine and GEOS-G (N) produced by Dainippon Ink & Chemicals, Inc. as ink. After printing of 5,000 sheets, the ink on the plate surface was cleaned by wiping the dot image area with a sponge for printing impregnated with PS Plate Cleaner CL-2 produced by Fuji Photo Film Co., Ltd. Thereafter, printing of 10,000 sheets was performed and the presence or absence of cutting of dots on the printed matter was visually observed.

Staining Test

Printing was conducted using R201 manufactured by Roland Co. as a printing machine and GEOS-G (S) produced by Dainippon Ink & Chemicals, Inc. as ink. The stain was evaluated by observing the non-image area (unexposed area) of the printed matter.

TABLE 3A

| | Photosensitive Layer | | | | | | Printing Performance | | |
|---|---|---|---|---|---|---|---|---|---|
| | | | | | | | Press Life of | Press Life of | Stain |
| No. | Addition-Polymerizable Compound | Binder Polymer | Sensitizing Dye | Titanocene Compound | Co-Sensitizer | Coating Amount ($mg/m^2$) | Developer Composition | Image Area (sheets) | Dot Image Area | Resistance of Non-Image Area |
| Example 11 | M-1 | B-1 | D7 | T-2 | H-2 | 1.3 | DV-1 | 80,000 | Good | Good |
| Example 12 | M-2 | B-2 | D13 | T-1 | H-5 | 1.0 | DV-2 | 50,000 | Good | Good |
| Example 13 | M-1 | B-1 | D16 | T-2 | H-2 | 1.3 | DV-1 | 50,000 | Good | Good |
| Example 14 | M-1 | B-2 | D23 | T-2 | H-5 | 2.0 | DV-1 | 70,000 | Good | Good |
| Example 15 | M-2 | B-3 | D30 | T-1 | H-5 | 2.0 | DV-3 | 130,000 | Good | Good |
| Example 16 | M-2 | B-3 | D1 | T-2 | H-5 | 1.5 | DV-3 | 110,000 | Good | Good |
| Example 17 | M-1 | B-2 | D7 | T-2 | H-2 | 1.3 | DV-2 | 70,000 | Good | Good |
| Example 18 | M-2 | B-2 | D30 | T-1 | H-4 | 1.5 | DV-2 | 60,000 | Good | Good |
| Example 19 | M-1 | B-1 | D13 | T-2 | H-5 | 2.0 | DV-1 | 50,000 | Good | Good |
| Comparative Example 7 | M-1 | B-2 | None | T-2 | H-2 | 1.0 | DV-1 | Image could not be formed | Image could not be formed | Good |

Addition-polymerizable Compounds (M-1) Pentaerythritol tetraacrylate (NK Ester A-YMMT, produced by Shin-Nakamura Chemical Co., Ltd.)
(M-2) Glycerin dimethacrylate hexamethylene diisocyanate urethane prepolymer (UA101H, produced by Kyoeisha Chemical Co., Ltd.)

Binder Polymers (B-1) Allyl methacrylate/methacrylic acid/N-isopropyl-acrylamide (copolymerization molar ratio: 67/13/20) Acid value measured by NaOH titration: 1.15 meq/g Weight average molecular weight measured by GPC: 130,000
(B-2) Allyl methacrylate/methacrylic acid copolymer (copolymerization molar ratio 83/17) Acid value measured by NaOH titration: 1.55 meq/g weight average molecular weight measured by GPC: 125,000
(B-3) Polyurethane resin of a condensation polymerization product of the following diisocyanates and diols 4,4'-Diphenylmethane diisocyanate (MDI) Hexamethylene diisocyanate (HMDI) Polypropylene glycol (weight average molecular weight: 1,000) (PPG 1000) 2,2-Bis(hydroxymethyl)propionic acid (DMPA) Copolymerization molar ratio (MDI/HMDI/PPG 1000/DMPA): 40/10/15/35 Acid value measured by NaQH titration: 1.05 meq/g Weight average molecular weight measured by GFC: 45,000

Developer

DV-1

An aqueous solution of pH 10 having the following composition:

| Monoethanolamine | 0.1 part by weight |
|---|---|
| Triethanolamine | 1.5 parts by weight |
| Compound of the following formula (7) (Pelex NBL, produced by Kao Atlas Co., Ltd.) | 4.0 parts by weight |
| Compound of the following formula (8) (Nukol B4SN, manufactured by Nippon Nyukazai Co., Ltd.) | 2.5 parts by weight |
| Compound of the following formula (9) | 0.2 part by weight |
| Water | 91.7 parts by weight |

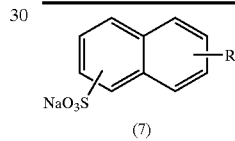

(7) Pelex NBL, produced by Kao Atlas Co., Ltd.

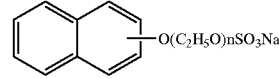

(8) Nukol B4SN, produced by Nippon Nyukazai Co., Ltd.

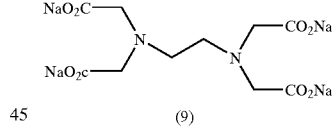

(9)

DV-2

An aqueous solution of pH 10 having the following composition:

| Sodium hydrogencarbonate | 1.2 parts by weight |
|---|---|
| Sodium carbonate | 0.8 parts by weight |
| Compound of formula (7) (Pelex NBL, produced by Kao Atlas Co., Ltd.) | 3.0 parts by weight |
| Compound of formula (8) (Nukol B4SN, produced by Nippon Nyukazai Co., Ltd.) | 2.0 parts by weight |
| Compound of formula (9) | 0.2 parts by weight |
| Water | 92.8 parts by weight |

DV-3

An aqueous solution of pH 13 having the following composition:

| | |
|---|---|
| 1K Potassium silicate | 3.0 parts by weight |
| Potassium hydroxide | 1.5 parts by weight |
| Compound of formula (9) | 0.2 parts by weight |
| Water | 95.3 parts by weight |

As is apparent from Table 3A, according to the present invention, an excellent lithographic printing plate is provided even under the condition such that plate-making can be performed with high productivity by scanning exposure, namely, under the very low energy exposure condition. On the other hand, in Comparative Example 7 wherein the initiation system of the present invention is not used, a practically usable lithographic printing plate cannot be obtained.

EXAMPLE 20

A lithographic printing plate precursor was prepared in the same manner as in Examples 1 to 6 except that the initiation system was changed to the following composition and the thickness of photopolymerization layer was changed to 1.5 g/m$^2$.

| Initiation system | | Content based on total solid content of photopolymerizable layer |
|---|---|---|
| Sensitizing dye | D7 | 1.3 wt % |
| Titanocene compound | T-2 | 1.5 wt % |
| Co-sensitizer | H-1 | 7.0 wt % |

The resulting lithographic printing plate precursor was subjected to scanning exposure using an InGaN semiconductor laser having an oscillation wavelength of 400 nm under the conditions of giving a beam diameter of 25 μm and an exposure energy density of 0.2 mJ/cm$^2$ on the plate surface. Subsequently, the plate was heated at 100° C. for 10 seconds and then developed in the same manner as in Examples 1 to 6 above.

A lithographic printing plate having a blue image with excellent visibility was obtained. Using the thus-obtained plate, offset printing was performed in a printing machine KOR-D manufactured by Heidelberg. As a result, 50,000 sheets or more of printed matters having excellent image density and stain resistance could be obtained.

EXAMPLE 21

The printing plate precursor of Example 20 was stored for 3 days under forced storage conditions of a humidity of 65% and 45° C. and then, the plate-making and printing were performed in the same manner as in Example 20. Similarly to Example 20, good results were obtained.

EXAMPLE 22

Evaluation of Safelight Aptitude

Safelights commonly used were measured on the emission intensity distribution, and the position where the emission intensity distribution in the short-wavelength side rose (short-wavelength end) was determined. Furthermore, the workability under each safelight was evaluated. The results are shown in Table 4A.

TABLE 4A

| Safelight | Short-Wavelength End of Emission | Workability |
|---|---|---|
| White lamp | 400 nm | Good. |
| Yellow lamp | 520 nm | Sufficiently bright for plate-making work. |
| Orange lamp | 570 nm | Considerably dark and difficult to work. Time was spent until getting accustomed to work. |
| Red lamp | 600 nm | Very dark. Skill was necessary for work. |

On taking account of workability, a yellow lamp is preferred. The photosensitive material capable of handling under a yellow lamp must have low photosensitivity at least at a wavelength of 520 nm, preferably 490 nm or more and from this point of view, the dyes according to the present invention are advantageous because they have the absorption maximum in the vicinity of 400 nm.

EXAMPLE 23

A lithographic printing plate precursor was prepared in the same manner as in Example 20 except that the initiation system Was changed to the following composition and the thickness of the photosensitive layer was changed to 2.0 g/m$^2$.

| Initiation system | | Content based on total solid content of photopolymerizable layer |
|---|---|---|
| Sensitizing dye | D12 | 1.6 wt % |
| Titanocene compound | T-2 | 1.5 wt % |
| Co-sensitizer | H-1 | 5.0 wt % |

The resulting lithographic printing plate precursor was subjected to scanning exposure using an InGaN semiconductor laser having an oscillation wavelength of 400 nm under the conditions of giving a beam diameter of 25 μm and an exposure energy density of 0.15 mJ/cm$^2$ on the plate surface. Subsequently, the plate was heated at 100° C. for 10 seconds and then developed in the same manner as in Example 20 above. A lithographic printing plate having a blue image with excellent visibility was obtained. The thus-obtained printing plate was further heated at 300° C. for 5 minutes and then, offset printing was performed in a printing machine KOR-D manufactured by Heidelberg. As a result, 200,000 sheets or more of printed matters having excellent image density and stain resistance could be obtained.

EXAMPLE 24

The printing plate precursor of Example 23 was irradiated with a yellow lamp for 30 minutes before the exposure and using the resulting printing plate precursor, print-making and printing were performed thoroughly in the same manner as in Example 23. Similarly to Example 23, good results were obtained.

COMPARATIVE EXAMPLE 8

A lithographic printing plate precursor was prepared in the same manner as in Example 23 except that Sensitizing Dye D12 (absorption maximum wavelength: 415 nm) was changed to DR-4 (absorption maximum wavelength: 500 nm). The lithographic printing plate precursor was subjected to plate-making in the same manner as in Example 23 using an InGaN semiconductor laser having an oscillation wavelength of 400 nm. As a result, the image could not be formed.

Separately, the lithographic printing plate precursor was irradiated with a yellow lamp for 30 minutes before the exposure in the same manner as in Example 24 and then the plate-making and printing were performed thoroughly in the same manner as in Example 23. As a result, the entire surface was fogged.

COMPARATIVE EXAMPLE 9

A printing plate was manufactured in the same manner as in Example 23 except that the laser was changed to FD-YAG (532 nm). As a result, an image having a clear sensitivity of 1.8 mJ/cm² was obtained. However, when the lithographic printing plate precursor prepared was irradiated with a yellow lamp for 30 minutes before the exposure in the same manner as in Example 24 and then, plate-making and printing were performed thoroughly in the same manner as in Example 23, the entire surface was fogged.

EXAMPLES 101 TO 110 AND COMPARATIVE EXAMPLES 101 TO 106

Photosensitive materials were prepared and evaluated in the same manner as in Examples 1 to 10 and Comparative Examples 1 to 6 except that the photopolymerization initiation system in the photosensitive composition of the photosensitive layer was changed as shown in Table 2B below. The results obtained are shown in Table 2B.

TABLE 2B

<Examples Using Stilbene Dye>

|  | Photopolymerization Initiation System (amount added: g) | | | Clear Sensitivity ($mJ/cm^2$) | Storage Stability (ratio of energy) |
|---|---|---|---|---|---|
|  | Sensitizing Dye | Titanocene Compound | Co-Sensitizer | | |
| Example 101 | D-II-5 (0.06) | T-2 (0.06) | H1 (0.2) | 0.2 | 1.05 |
| Example 102 | D-II-12 (0.08) | T-2 (0.12) | H5 (0.2) | 0.1 | 1.0 |
| Example 103 | D-II-3 (0.05) | T-1 (0.06) | None | 0.4 | 1.0 |
| Example 104 | D-II-6 (0.05) | T-2 (0.06) | None | 0.3 | 1.05 |
| Example 105 | D-II-6 (0.06) | T-2 (0.12) | H5 (0.2) | 0.1 | 1.05 |
| Example 106 | D-II-8 (0.06) | T-2 (0.15) | None | 0.4 | 1.05 |
| Example 107 | D-II-15 (0.10) | T-1 (0.06) | H2 (0.2) | 0.2 | 1.05 |
| Example 108 | D-II-8 (0.06) | T-1 (0.03) | None | 0.5 | 1.0 |
| Example 109 | D-II-16 (0.06) | T-2 (0.06) | None | 0.4 | 1.0 |
| Example 110 | D-II-18 (0.06) | T-1 (0.12) | H1 (0.2) | 0.2 | 1.0 |
| Comparative Example 101 | D-II-6 (0.07) | None | None | Image could not be formed | Could not be evaluated |
| Comparative Example 102 | None | T-1 (0.06) | none | 1.8 | 1.6 |
| Comparative Example 103 | None | T-2 (0.12) | H1 (0.2) | 1.0 | 1.5 |
| Comparative Example 104 | DR-2 (0.06) | T-1 (0.06) | None | 1.4 | 1.4 |
| Comparative Example 105 | DR-2 (0.12) | T-2 (0.12) | None | 0.9 | 1.5 |
| Comparative Example 106 | DR-1 (0.06) | H-3 (0.06) | None | 1.8 | 1.6 |

As seen from Table 2B, the lithographic printing plate precursor according to the present invention has very high sensitivity and exhibits sufficiently high sensitivity for the scanning exposure system.

The photopolymerization initiation system according to the present invention has high sensitivity as compared with the case of using no sensitizing dye and even in the case where the amount of titanocene added is small, exhibits sufficiently high sensitivity.

Further, the lithographic printing plate precursor of the present invention exhibits excellent storage stability that is sufficient for the production.

EXAMPLES 111 TO 119 AND COMPARATIVE EXAMPLE 107

Lithographic printing plates were manufactured in the same manner as in Examples 11 to 19 and Comparative Example 7 except for changing the photosensitive composition of the photosensitive layer and the developer composition as shown in Table 3B below, and evaluated on the printing performance. The results obtained are shown in Table 3B. In Table 3B, Addition-Polymerizable Compounds M-1 and M-2, Binder Polymers B-1 to B-3 and Developer Compositions DV-1 to DV-3 were the same as those in Table 3A.

sheets or more of printed matters having excellent image density and stain resistance could be obtained.

EXAMPLE 121

The printing plate precursor of Example 120 was stored for 3 days under forced storage conditions of a humidity of

TABLE 3B

| | Photosensitive Layer | | | | | | Printing Performance | | |
|---|---|---|---|---|---|---|---|---|---|
| No. | Addition-Polymerizable Compound | Binder Polymer | Sensitizing Dye | Titanocene Compound | Co-Sensitizer | Coating Amount ($mg/m^2$) | Developer Composition | Press Life of Image Area (sheets) | Press Life of Dot Image Area | Stain Resistance of Non-Image Area |
| Example 111 | M-1 | B-1 | D-II-11 | T-1 | H-5 | 1.5 | DV-1 | 60,000 | Good | Good |
| Example 112 | M-1 | B-1 | D-II-6 | T-2 | H-2 | 1.8 | DV-2 | 90,000 | Good | Good |
| Example 113 | M-1 | B-2 | D-II-3 | T-1 | H-5 | 1.0 | DV-1 | 40,000 | Good | Good |
| Example 114 | M-1 | B-1 | D-II-6 | T-1 | H-2 | 2.3 | DV-1 | 70,000 | Good | Good |
| Example 115 | M-2 | B-3 | D-II-16 | T-2 | H-5 | 1.0 | DV-3 | 150,000 | Good | Good |
| Example 116 | M-2 | B-3 | D-II-6 | T-2 | H-5 | 1.8 | DV-3 | 130,000 | Good | Good |
| Example 117 | M-1 | B-1 | D-II-15 | T-1 | H-2 | 1.4 | DV-2 | 70,000 | Good | Good |
| Example 118 | M-2 | B-3 | D-II-8 | T-1 | H-2 | 2.0 | DV-3 | 60,000 | Good | Good |
| Example 119 | M-1 | B-1 | D-II-16 | T-1 | H-5 | 1.0 | DV-1 | 50,000 | Good | Good |
| Comparative Example 107 | M-1 | B-1 | None | T-2 | H-5 | 1.5 | DV-1 | Image could not be formed | Image could not be formed | Good |

As is apparent from Table 3B, according to the present invention, an excellent lithographic printing plate is provided even under the condition such that plate-making can be performed with high productivity by scanning exposure, namely, under the very low energy exposure condition. On the other hand, in Comparative Example 107 wherein the initiation system of the present invention is not used, a practically usable lithographic printing plate cannot be obtained.

EXAMPLE 120

A lithographic printing plate precursor was prepared in the same manner as in Examples 111 to 116 except that the initiation system was changed to the following composition and the thickness of photopolymerization layer was changed to 1.5 $g/m^2$.

| Initiation system | | Content based on total solid contents of photopolymerizable layer |
|---|---|---|
| Sensitizing dye | D-II-7 | 1.3 wt % |
| Titanocene compound | T-2 | 1.5 wt % |
| Co-sensitizer | H-1 | 7.0 wt % |

The obtained lithographic printing plate precursor was subjected to scanning exposure using an InGaN semiconductor laser having an oscillation wavelength of 400 nm under the conditions of giving a beam diameter of 25 μm and an exposure energy density of 0.2 $mJ/cm^2$ on the plate surface. Subsequently, the plate was heated at 100° C. for 10 seconds and then developed in the same manner as in Examples 101 to 106 above.

A lithographic printing plate having a blue image with excellent visibility was obtained. Using the thus-obtained plate, offset printing was performed in a printing machine KOR-D manufactured by Heidelberg. As a result, 50,000

65% and 45° C. and then, the plate-making and printing were performed in the same manner as in Example 120. Similarly to Example 120, good results were obtained.

EXAMPLE 122

Evaluation of Safelight Aptitude

Safelights commonly used were measured on the emission intensity distribution and the position where the emission intensity distribution in the short-wavelength side arose (short-wavelength end) was determined. Furthermore, the workability under each safelight was evaluated. The results are shown in Table 4B.

TABLE 4B

| Safelight | Short-Wavelength End of Emission | Workability |
|---|---|---|
| White lamp | 400 nm | Good. |
| Yellow lamp | 520 nm | Sufficiently bright for plate-making work. |
| Orange lamp | 570 nm | Considerably dark and difficult to work. Time was spent until getting accustomed to work. |
| Red lamp | 600 nm | Very dark. Skill was necessary for work. |

On taking account of workability, a yellow lamp is preferred. The photosensitive material capable of handling under a yellow lamp must have low photosensitivity at least at a wavelength of 520 nm, preferably 490 nm or more and from this point of view, the dyes according to the present invention are advantageous because they have the absorption maximum in the vicinity of 400 nm.

EXAMPLE 123

A lithographic printing plate precursor was prepared in the same manner as in Example 120 except that the initiation system was changed to the following composition and the thickness of the photosensitive layer was changed to 2.0 g/m².

| Initiation system | | Content based on total solid content of photopolymerizable layer |
|---|---|---|
| Sensitizing dye | D-II-7 | 1.4 wt % |
| Titanocene compound | T-2 | 1.5 wt % |
| Co-sensitizer | H-1 | 5.0 wt % |

The resulting lithographic printing plate precursor was subjected to scanning exposure using an InGaN semiconductor laser having an oscillation wavelength of 400 nm under the conditions of giving a beam diameter of 25 μm and an exposure energy density of 0.15 mJ/cm² on the plate surface. Subsequently, the plate was heated at 100° C. for 10 seconds and then developed in the same manner as in Example 120 above. A lithographic printing plate having a blue image with excellent visibility was obtained. The thus-obtained printing plate was further heated at 300° C. for 5 minutes and then, offset printing was performed in a printing machine KOR-D manufactured by Heidelberg. As a result, 200,000 sheets or more of printed matters having excellent image density and stain resistance could be obtained.

EXAMPLE 124

The printing plate precursor of Example 123 was irradiated with a yellow lamp for 30 minutes before the exposure and using the resulting printing plate precursor, print-making and printing were performed thoroughly in the same manner as in Example 123. Similarly to Example 123, good results were obtained.

COMPARATIVE EXAMPLE 108

A lithographic printing plate precursor was prepared in the same manner as in Example 123 except that Sensitizing Dye D-II-7 (absorption maximum wavelength: 390 nm) was changed to DR-4 (absorption maximum wavelength: 500 nm). The lithographic printing plate precursor was subjected to plate-making in the same manner as in Example 123 using an InGaN semiconductor laser having an oscillation wavelength of 400 nm. As a result, the image could not be formed. Separately, the lithographic printing plate precursor was irradiated with a yellow lamp for 30 minutes before the exposure in the same manner as in Example 124 and then the plate-making and printing were performed thoroughly in the same manner as in Example 123, As a result, the entire surface was fogged.

COMPARATIVE EXAMPLE 109

A printing plate was manufactured in the same manner as in Example 123 except that the laser was changed to FD-YAG (532 nm). As a result, an image having a clear sensitivity of 1.8 mJ/cm² was obtained. However, when the lithographic printing plate precursor prepared was irradiated with a yellow lamp for 30 minutes before the exposure in the same manner as in Example 124 and then, plate-making and printing were performed thoroughly in the same manner as in Example 123, the entire surface was fogged.

EXAMPLES 201 TO 210 AND COMPARATIVE EXAMPLES 201 TO 206

Photosensitive materials were prepared and evaluated in the same manner as in Examples 1 to 10 and Comparative Examples 1 to 6 except that the photopolymerization initiation system in the photosensitive composition of the photosensitive layer was changed as shown in Table 1C below.

The results obtained are shown in Table 1C.

TABLE 1C

<Examples Using Pyrrolopyrrole Dye>

| | Photopolymerization Initiation System (amount added: g) | | | Clear Sensitivity (mJ/cm²) | Storage Stability (ratio of energy) |
|---|---|---|---|---|---|
| | Sensitizing Dye | Titanocene Compound | Co-Sensitizer | | |
| Example 201 | D-III-2 (0.06) | T-1 (0.06) | H1 (0.2) | 0.3 | 1.0 |
| Example 202 | D-III-2 (0.05) | T-2 (0.12) | H1 (0.2) | 0.2 | 1.05 |
| Example 203 | D-III-12 (0.08) | T-2 (0.06) | None | 0.4 | 1.05 |
| Example 204 | D-III-6 (0.06) | T-1 (0.06) | H5 (0.2) | 0.1 | 1.0 |
| Example 205 | D-III-18 (0.05) | T-2 (0.12) | H1 (0.5) | 0.2 | 1.0 |
| Example 206 | D-III-2 (0.05) | T-2 (0.15) | None | 0.4 | 1.1 |
| Example 207 | D-III-12 (0.06) | T-2 (0.06) | H5 (0.2) | 0.1 | 1.0 |
| Example 208 | D-III-2 (0.10) | T-1 (0.03) | None | 0.5 | 1.05 |
| Example 209 | D-III-3 (0-08) | T-2 (0.06) | None | 0.5 | 1.0 |
| Example 210 | D-III-1 (0.06) | T-1 (0.12) | H1 (0.2) | 0.3 | 1.0 |
| Comparative Example 201 | D-III-2 (0.06) | None | None | Image could not be formed | Could not be evaluated |
| Comparative Example 202 | None | T-2 (0.06) | None | 1.9 | 1.5 |
| Comparative Example 203 | None | T-2 (0.06) | H1 (0.2) | 1.2 | 1.6 |
| Comparative Example 204 | DR-2 (0.06) | T-1 (0.06) | None | 1.4 | 1.5 |

TABLE 1C-continued

<Examples Using Pyrrolopyrrole Dye>

| | Photopolymerization Initiation System (amount added: g) | | | Clear Sensitivity $(mJ/cm^2)$ | Storage Stability (ratio of energy) |
|---|---|---|---|---|---|
| | Sensitizing Dye | Titanocene Compound | Co-Sensitizer | | |
| Comparative Example 205 | DR-2 (0.12) | T-2 (0.06) | None | 1.1 | 1.4 |
| Comparative Example 206 | D-1 (0.06) | H-3 (0.06) | None | 1.8 | 1.7 |

As seen from Table 1C, the lithographic printing plate precursor according to the present invention has very high sensitivity and exhibits sufficiently high sensitivity for the scanning exposure system.

The photopolymerization initiation system according to the present invention has high sensitivity as compared with the case of using no sensitizing dye and even in the case where the amount of titanocene added is small, exhibits sufficiently high sensitivity.

Further, the lithographic printing plate precursor of the present invention exhibits excellent storage stability that is sufficient for the production.

EXAMPLES 211 TO 219 AND COMPARATIVE EXAMPLE 207

Lithographic printing plates were manufactured in the same manner as in Examples 11 to 19 and Comparative Example 7 except for changing the photosensitive composition of the photosensitive layer and the developer composition as shown in Table 2C below, and evaluated on the printing performance. The results obtained are shown in Table 2C. In Table 2C, Addition-Polymerizable Compounds M-1 and M-2, Binder Polymers B-1 to B-3 and Developer Compositions DV-1 to DV-3 were the same as those in Table 3A.

be performed with high productivity by scanning exposure, namely, under the very low energy exposure condition. On the other hand, in Comparative Example 207 wherein the initiation system of the present invention is not used, a practically usable lithographic printing plate cannot be obtained.

EXAMPLE 220

A lithographic printing plate precursor was prepared in the same manner as in Examples 201 to 206 except that the initiation system was changed to the following composition and the thickness of photopolymerization layer was changed to 1.5 $g/m^2$.

| Initiation system | | Content based on total solid contents of photopolymerizable layer |
|---|---|---|
| Sensitizing dye | D-III-3 | 1.4 wt % |
| Titanocene compound | T-2 | 1.5 wt % |
| Co-sensitizer | H-1 | 7.0 wt % |

The resulting lithographic printing plate precursor was subjected to scanning exposure using an InGaN semiconductor laser having an oscillation wavelength of 400 nm

TABLE 2C

| | Photosensitive Layer | | | | | | | Printing Performance | | |
|---|---|---|---|---|---|---|---|---|---|---|
| No. | Addition-Polymerizable Compound | Binder Polymer | Sensi-tizing Dye | Titanocene Compound | Co-Sensitizer | Coating Amount $(mg/m^2)$ | Developer Composition | Press Life of Image Area (sheets) | Press Life of Dot Image Area | Stain Resistance of Non-Image Area |
| Example 211 | M-1 | B-1 | D-III-2 | T-2 | H-5 | 1.5 | DV-1 | 90,000 | Good | Good |
| Example 212 | M-2 | B-1 | D-III-12 | T-1 | H-2 | 1.8 | DV-2 | 60,000 | Good | Good |
| Example 213 | M-1 | B-2 | D-III-2 | T-1 | H-2 | 1.0 | DV-1 | 50,000 | Good | Good |
| Example 214 | M-1 | B-1 | D-III-3 | T-2 | H-2 | 2.3 | DV-1 | 70,000 | Good | Good |
| Example 215 | M-2 | B-3 | D-III-2 | T-2 | H-5 | 1.8 | DV-3 | 150,000 | Good | Good |
| Example 216 | M-2 | B-3 | D-III-2 | T-1 | H-5 | 1.0 | DV-3 | 120,000 | Good | Good |
| Example 217 | M-1 | B-1 | D-III-1 | T-2 | H-5 | 1.5 | DV-2 | 70,000 | Good | Good |
| Example 218 | M-2 | B-2 | D-III-2 | T-2 | H-5 | 1.8 | DV-2 | 50,000 | Good | Good |
| Example 219 | M-1 | B-1 | D-III-6 | T-1 | H-5 | 2.5 | DV-1 | 60,000 | Good | Good |
| Comparative Example 207 | M-1 | B-1 | None | T-1 | H-2 | 1.5 | DV-1 | Image could not be formed | Image could not be formed | Good |

As is apparent from Table 2C, according to the present invention, an excellent lithographic printing plate is provided even under the condition such that plate-making can under the conditions of giving a beam diameter of 25 μm and an exposure energy density of 0.2 $mJ/cm^2$ on the plate surface. Subsequently, the plate was heated at 100° C. for 10 seconds and then developed in the same manner as in Examples 201 to 206 above.

A lithographic printing plate having a blue image with excellent visibility was obtained. Using the thus-obtained plate, offset printing was performed in a printing machine KOR-D manufactured by Heidelberg. As a result, 50,000 sheets or more of printed matters having excellent image density and stain resistance could be obtained.

EXAMPLE 221

The printing plate precursor of Example 220 was stored for 3 days under forced storage conditions of a humidity of 65% and 45° C. and then, the plate-making and printing were performed in the same manner as in Example 220. Similarly to Example 220, good results were obtained.

EXAMPLE 222

Evaluation of Safelight Aptitude

Safelights commonly used were measured on the emission intensity distribution, and the position where the emission intensity distribution in the short-wavelength side rose (short-wavelength end) was determined. Furthermore, the workability under each safelight was evaluated. The results are shown in Table 3C.

TABLE 3C

| Safelight | Short-Wavelength End of Emission | Workability |
| --- | --- | --- |
| White lamp | 400 nm | Good. |
| Yellow lamp | 520 nm | Sufficiently bright for plate-making work. |
| Orange lamp | 570 nm | Considerably dark and difficult to work. Time was spent until getting accustomed to work. |
| Red lamp | 600 nm | Very dark. Skill was necessary for work. |

On taking account of workability, a yellow lamp is preferred. The photosensitive material capable of handling under a yellow lamp must have low photosensitivity at least at a wavelength of 520 nm, preferably 490 nm or more and from this point of view, the dyes according to the present invention are advantageous because they have the absorption maximum in the vicinity of 400 nm.

EXAMPLE 223

A lithographic printing plate precursor was prepared in the same manner as in Example 220 except that the initiation system was changed to the following composition and the thickness of the photosensitive layer was changed to 2.0 g/m$^2$.

| Initiation system | | Content based on total solid content of photopolymerizable layer |
| --- | --- | --- |
| Sensitizing dye | D-III-12 | 1.4 wt % |
| Titanocene compound | T-2 | 1.5 wt % |
| Co-sensitizer | H-1 | 5.0 wt % |

The resulting lithographic printing plate precursor was subjected to scanning exposure using an InGaN semiconductor laser having an oscillation wavelength of 400 nm under the conditions of giving a beam system of 25 μm and an exposure energy density of 0.15 mJ/cm$^2$ on the plate surface. Subsequently, the plate was heated at 100° C. for 10 seconds and then developed in the same manner as in Example 220 above. A lithographic printing plate having a blue image with excellent visibility was obtained. The thus-obtained printing plate was further heated at 300° C. for 5 minutes and then, offset printing was performed in a printing machine KOR-D manufactured by Heidelberg, as a result, 200,000 sheets or more of printed matters having excellent image density and stain resistance could be obtained.

EXAMPLE 224

The printing plate precursor of Example 223 was irradiated with a yellow lamp for 30 minutes before the exposure and using the resulting printing plate precursor, print-making and printing were performed thoroughly in the same manner as in Example 223. Similarly to Example 223, good results were obtained.

COMPARATIVE EXAMPLE 208

A lithographic printing plate precursor was prepared in the same manner as in Example 223 except that Sensitizing Dye D-III-12 (absorption maximum wavelength: 395 nm) was changed to DR-4 (absorption maximum wavelength: 500 nm). The lithographic printing plate precursor was subjected to plate-making in the same manner as in Example 223 using an InGaN semiconductor laser having an oscillation wavelength of 400 nm. As a result, the image formed had streaks. Separately, the lithographic printing plate precursor was irradiated with a yellow lamp for 30 minutes before the exposure in the same manner as in Example 224 and then the plate-making and printing were performed thoroughly in the same manner as in Example 223. As a result, the entire surface was fogged.

COMPARATIVE EXAMPLE 209

A printing plate was manufactured in the same manner as in Example 223 except that the laser was changed to FD-YAG (532 nm). As a result, an image having a clear sensitivity of 1.8 mJ/cm$^2$ was obtained. However, when the lithographic printing plate precursor prepared was irradiated with a yellow lamp for 30 minutes before the exposure in the same manner as in Example 224 and then, plate-making and printing were performed thoroughly in the same manner as in Example 223, the entire surface was fogged.

The sensitizing dyes used in Examples are described hereinbefore in the specification and structures of other compounds are shown below.

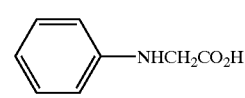

(H1)

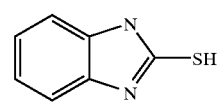

(H2)

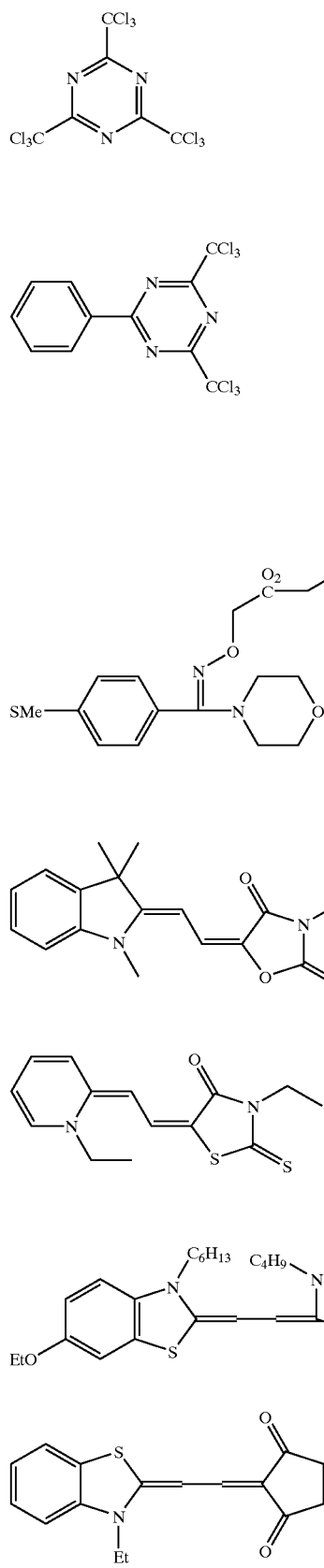

As described above, the photosensitive composition of the present invention comprises (i) a sensitizing dye having a structure represented by formula (I), (II) or (III), (ii) a titanocene compound and (iii) a compound of undergoing a reaction with at least one of a radical and an acid to change at least one of its physical and chemical properties and maintaining the changed physical or chemical property, whereby a lithographic printing plate precursor using the photosensitive composition can have sufficiently high sensitivity suitable for the scanning exposure by a short wavelength semiconductor laser such as InGaN and provide a lithographic printing plate excellent in the press life and stain resistance. The lithographic printing plate precursor for scanning exposure of the present invention is remarkably improved in the fogging under a yellow lamp, so that the workability of handling the printing plate precursor can be greatly improved. Furthermore, the photosensitive composition of the present invention has not only excellent sensitivity but also very excellent storage stability.

The entire disclosure of each and every foreign patent application from which the benefit of foreign priority has been claimed in the present application is incorporated herein by reference, as if fully set forth herein.

While the invention has been described in detail and with reference to specific embodiments thereof, it will be apparent to one skilled in the art that various changes and modifications can be made therein without departing from the spirit and scope thereof.

What is claimed is:

1. A photosensitive composition comprising (i) a sensitizing dye represented by the following formula (I), (ii) a titanocene compound and (iii) a compound of undergoing a reaction with at least one of a radical and an acid to change at least one of its physical and chemical properties and maintaining the changed physical or chemical property:

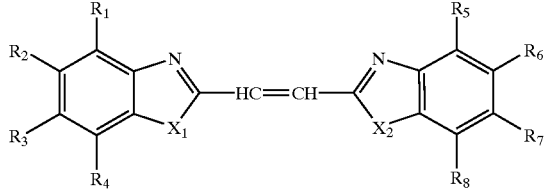

wherein $R_1$ to $R_8$ each independently represents a hydrogen atom, a halogen atom, a substituted or unsubstituted alkyl, alkoxy, alkylthio, aryloxy, arylthio, alkenyl, aralkyl, acyl, aryl, heteroaryl or alkylsulfonic acid group having 20 or less carbon atoms, and $X_1$ and $X_2$ each independently represents an oxygen atom or a sulfur atom.

2. The photosensitive composition as claimed in claim 1, wherein the compound of undergoing a reaction with at least one of a radical and an acid to change at least one of its physical and chemical properties and maintaining the changed physical or chemical property and is an addition-polymerizable compound having an ethylenically unsaturated double bond.

3. The photosensitive composition as claimed in claim 1 further comprising a binder polymer comprising an aqueous alkali-soluble or swellable linear organic polymer.

4. The photosensitive composition as claimed in claim 1, wherein the aqueous alkali-soluble or swellable linear organic polymer is a urethane resin having an alkali-soluble group.

5. The photosensitive composition as claimed in claim 1 further comprising an oxime ether compound as a co-sensitizer.

6. A photosensitive composition comprising (i) a sensitizing dye represented by the following formula (I), (ii) a titanocene compound and (iii) a radical-polymerizable compound having an ethylenically unsaturated double bond:

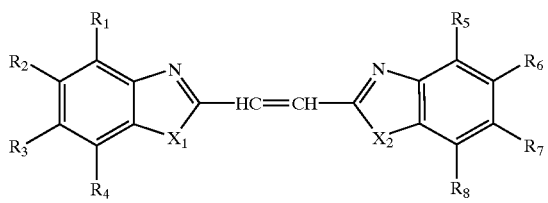

wherein $R_1$ to $R_8$ each independently represents a hydrogen atom, a halogen atom, a substituted or unsubstituted alkyl, alkoxy, alkylthio, aryloxy, arylthio, alkenyl, aralkyl, acyl, aryl, heteroaryl or alkylsulfonic acid group having 20 or less carbon atoms, and $X_1$ and $X_2$ each independently represents an oxygen atom or a sulfur atom.

7. The photosensitive composition as claimed in claim 6 further comprising a binder polymer comprising an aqueous alkali-soluble or swellable linear organic polymer.

8. A photosensitive lithographic printing plate comprising a support and a photosensitive layer comprising (i) a sensitizing dye represented by the following formula (I), (ii) a titanocene compound and (iii) a compound of undergoing a reaction with at least one of a radical and an acid to change at least one of its physical and chemical properties and maintaining the changed physical or chemical property:

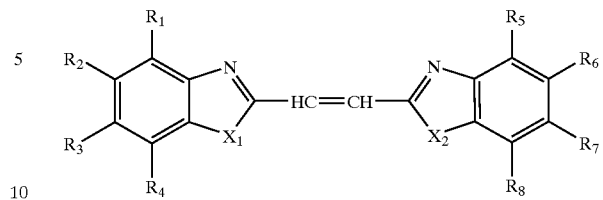

wherein $R_1$ to $R_8$ each independently represents a hydrogen atom, a halogen atom, a substituted or unsubstituted alkyl, alkoxy, alkylthio, aryloxy, arylthio, alkenyl, aralkyl, acyl, aryl, heteroaryl or alkylsulfonic acid group having 20 or less carbon atoms, and $X_1$ and $X_2$ each independently represents an oxygen atom or sulfur atom.

9. The photosensitive lithographic printing plate as claimed in claim 8, wherein the compound of undergoing a reaction with at least one of a radical and an acid to change at least one of its physical and chemical properties and maintaining the changed physical or chemical property and is an addition-polymerizable compound having an ethylenically unsaturated double bond.

10. The photosensitive lithographic printing plate as claimed in claim 8, wherein the photosensitive layer further comprising a binder polymer comprising an aqueous alkali-soluble or swellable linear organic polymer.

11. The photosensitive lithographic printing plate as claimed in claim 10, wherein the aqueous alkali-soluble or swellable linear organic polymer is a urethane resin having an alkali-soluble group.

12. The photosensitive lithographic printing plate as claimed in claim 10, further comprising a protective layer containing polyvinyl alcohol.

13. A photopolymerization method comprising exposing the photosensitive composition as claimed in claim 1 with a laser beam having a wavelength of 450 nm or less.

14. A method of preparing a lithographic printing plate comprising exposing the photosensitive lithographic printing plate as claimed in claim 8 with a laser beam having a wavelength of 450 nm or less and developing the exposed photosensitive lithographic printing plate with an aqueous alkali developing solution.

15. The method of preparing a lithographic printing plate as claimed in claim 14, wherein the aqueous alkali developing solution has a pH of from 9.5 to 14.0.

16. The method of preparing a lithographic printing plate as claimed in claim 15, wherein the exposure of the photosensitive lithographic printing plate is conducted using a laser beam having an exposure wavelength in a range of from 390 to 430 nm.

17. A photosensitive composition comprising (i) a sensitizing dye represented by the following formula (II), (ii) a titanocene compound and (iii) a compound of undergoing a reaction with at least one of a radical and an acid to change at least one of its physical and chemical properties and maintaining the changed physical or chemical property:

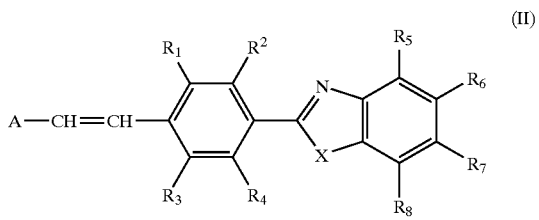

(II)

wherein $R_1$ to $R_8$ each independently represents a hydrogen atom, a halogen atom, a substituted or unsubstituted alkyl, alkoxy, alkylthio, aryloxy, arylthio, alkenyl, aralkyl, acyl, aryl, heteroaryl or alkylsulfonic acid group having 20 or less carbon atoms, X represents an oxygen atom or a sulfur atom, and A represents a substituted or unsubstituted aryl or heteroaryl group having 20 or less carbon atoms.

18. The photosensitive composition as claimed in claim 17, wherein the compound of undergoing a reaction with at least one of a radical and an acid to change at least one of its physical and chemical properties and maintaining the changed physical or chemical property and is an addition-polymerizable compound having an ethylenically unsaturated double bond.

19. The photosensitive composition as claimed in claim 17 further comprising a binder polymer comprising an aqueous alkali-soluble or swellable linear organic polymer.

20. The photosensitive composition as claimed in claim 17, wherein the aqueous alkali-soluble or swellable linear organic polymer is urethane resin having an alkali-soluble group.

21. The photosensitive composition as claimed in claim 17 further comprising an oxime ether compound as a co-sensitizer.

22. A photosensitive composition comprising (i) a sensitizing dye represented by the following formula (II), (ii) a titanocene compound and (iii) a radical-polymerizable compound having an ethylenically unsaturated double bond:

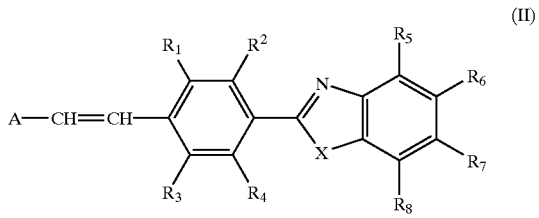

(II)

wherein $R_1$ to $R_8$ each independently represents a hydrogen atom, a halogen atom, a substituted or unsubstituted alkyl, alkoxy, alkylthio, aryloxy, arylthio, alkenyl, aralkyl, acyl, aryl, heteroaryl or alkylsulfonic acid group having 20 or less carbon atoms, X represents an oxygen atom or a sulfur atom, and A represents a substituted or unsubstituted aryl or heteroaryl group having 20 or less carbon atoms.

23. The photosensitive composition as claimed in claim 22 above further comprising a binder polymer comprising an aqueous alkali-soluble or swellable linear organic polymer.

24. A photosensitive lithographic printing plate comprising a support and a photosensitive layer comprising (i) a sensitizing dye represented by the following formula (II), (ii) a titanocene compound and (iii) a compound of undergoing a reaction with at least one of a radical and an acid to change at least one of its physical and chemical properties and maintaining the changed physical or chemical property:

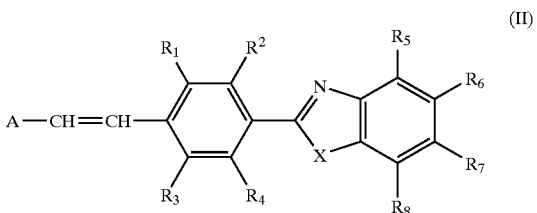

(II)

wherein $R_1$ to $R_8$ each independently represents a hydrogen atom, a halogen atom, a substituted or unsubstituted alkyl, alkoxy, alkylthio, aryloxy, arylthio, alkenyl, aralkyl, acyl, aryl, heteroaryl or alkylsulfonic acid group having 20 or less carbon atoms, X represents an oxygen atom or a sulfur atom, and A represents a substituted or unsubstituted aryl or heteroaryl group having 20 or less carbon atoms.

25. The photosensitive lithographic printing plate as claimed in claim 24, wherein the compound of undergoing a reaction with at least on of a radical and an acid to change at least one of its physical and chemical properties and maintaining the changed physical or chemical property and is an addition-polymerizable compound having an ethylenically unsaturated double bond.

26. The photosensitive lithographic printing plate as claimed in claim 24, wherein the photosensitive layer further comprising a binder polymer comprising an aqueous alkali-soluble or swellable linear organic polymer.

27. The photosensitive lithographic printing plate as claimed in claim 26, wherein the aqueous alkali-soluble or swellable linear organic polymer is a urethane resin having an alkali-soluble group.

28. The photosensitive lithographic printing plate as claimed in claim 24 further comprising a protective layer containing polyvinyl alcohol.

29. A photopolymerization method comprising exposing the photosensitive composition as claimed in claim 17 with a laser beam having a wavelength of 450 nm or less.

30. A method of preparing a lithographic printing plate comprising exposing the photosensitive lithographic printing plate as claimed in claim 24 with a laser beam having a wavelength of 450 nm or less and developing the exposed photosensitive lithographic printing plate with an aqueous alkali developing solution.

31. The method of preparing a lithographic printing plate as claimed in claim 30, wherein the aqueous alkali developing solution has a pH of from 9.5 to 14.0.

32. The method of preparing a lithographic printing plate as claimed in claim 31, wherein the exposure of the photosensitive lithographic printing plate is conducted using a laser beam having an exposure wavelength in a range of from 390 to 430 nm.

33. A photosensitive composition comprising (i) a sensitizing dye represented by the following formula (III), (ii) a titanocene compound and (iii) a compound of undergoing a reaction with at least one of a radical and an acid to change at least one of its physical and chemical properties and maintaining the changed physical or chemical property:

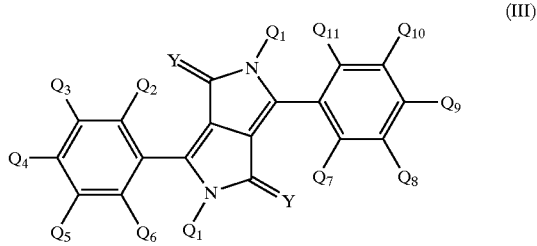

(III)

wherein Y represents an oxygen atom or a sulfur atom, $Q_1$ represents a methyl group, an ethyl group or a phenyl group which may have a substituent, $Q_2$ to $Q_{11}$ each independently represents a hydrogen atom, a halogen atom, a cyano group, a nitro group, a sulfonic acid group, or an alkyl group having from 1 to 5 carbon atoms, which may have a substituent.

34. The photosensitive composition as claimed in claim 33, wherein the compound of undergoing a reaction with at least one of a radical and an acid to change at least one of its physical and chemical properties and maintaining the changed physical or chemical property and is an addition-polymerizable compound having an ethylenically unsaturated double bond.

35. The photosensitive composition as claimed in claim 33 further comprising a binder polymer comprising an aqueous alkali-soluble or swellable linear organic polymer.

36. The photosensitive composition as claimed in claim 33, wherein the aqueous alkali-soluble or swellable linear organic polymer is a urethane resin having an alkali-soluble group.

37. The photosensitive composition as claimed in claim 33 further comprising an oxime ether compound as a co-sensitizer.

38. A photosensitive composition comprising (i) a sensitizing dye represented by the following formula (III), (ii) a titanocene compound and (iii) a radical-polymerizable compound having an ethylenically unsaturated double bond:

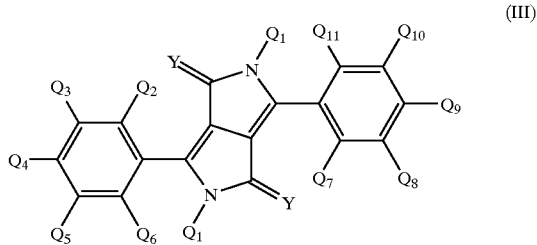

(III)

wherein Y represents an oxygen atom or a sulfur atom, $Q_1$ represents a methyl group, an ethyl group or a phenyl group which may have a substituent, $Q_2$ to $Q_{11}$ each independently represents a hydrogen atom, a halogen atom, a cyano group, a nitro group, a sulfonic acid group, or an alkyl group having from 1 to 5 carbon atoms, which may have a substituent.

39. The photosensitive composition as claimed in claim 38 above further comprising a binder polymer comprising an aqueous alkali-soluble or swellable linear organic polymer.

40. A photosensitive lithographic printing plate comprising a support and a photosensitive layer comprising (i) a sensitizing dye represented by the following formula (III), (ii) a titanocene compound and (iii) a compound of undergoing a reaction with at least one of a radical and an acid to change at least one of its physical and chemical properties and maintaining the changed physical or chemical property:

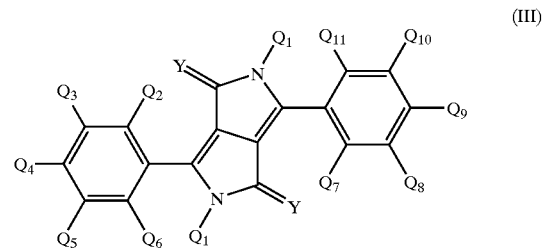

(III)

wherein Y represents an oxygen atom or a sulfur atom, $Q_1$ represents a methyl group, an ethyl group or a phenyl group which may have a substituent, $Q_2$ to $Q_{11}$ each independently represents a hydrogen atom, a halogen atom, a cyano group, a nitro group, a sulfonic acid group, or an alkyl group having from 1 to 5 carbon atoms, which may have a substituent.

41. The photosensitive lithographic printing plate as claimed in claim 40, wherein the compound of undergoing a reaction with at least one of a radical and an acid to change at least one of its physical and chemical properties and maintaining the changed physical or chemical property and is an addition-polymerizable compound having an ethylenically unsaturated double bond.

42. The photosensitive lithographic printing plate as claimed in claim 40, wherein the photosensitive layer further comprising a binder polymer comprising an aqueous alkali-soluble or swellable linear organic polymer.

43. The photosensitive lithographic printing plate as claimed in claim 42, wherein the aqueous alkali-soluble or swellable linear organic polymer is a urethane resin having an alkali-soluble group.

44. The photosensitive lithographic printing plate as claimed in claim 40 further comprising a protective layer containing polyvinyl alcohol.

45. A photopolymerization method comprising exposing the photosensitive composition as claimed in claim 33 with a laser beam having a wavelength of 450 nm or less.

46. A method of preparing a lithographic printing plate comprising exposing the photosensitive lithographic printing plate as claimed in claim 40 with a laser beam having a wavelength of 450 nm or less and developing the exposed photosensitive lithographic printing plate with an aqueous alkali developing solution.

47. The method of preparing a lithographic printing plate as claimed in claim 46, wherein the aqueous alkali developing solution has a pH of from 9.5 to 14.0.

48. The method of preparing a lithographic printing plate as claimed in claim 47, wherein the exposure of the photosensitive lithographic printing plate is conducted using a laser beam having an exposure wavelength in a range of from 390 to 430 nm.

* * * * *